(12) United States Patent
Chiriac et al.

(10) Patent No.: US 9,329,646 B2
(45) Date of Patent: May 3, 2016

(54) MULTI-LAYER HEAT DISSIPATING APPARATUS FOR AN ELECTRONIC DEVICE

(71) Applicant: QUALCOMM Incorporated, San Diego, CA (US)

(72) Inventors: Victor Adrian Chiriac, San Diego, CA (US); Youmin Yu, San Diego, CA (US); Dexter Tamio Chun, San Diego, CA (US); Stephen Arthur Molloy, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 168 days.

(21) Appl. No.: 14/221,171

(22) Filed: Mar. 20, 2014

(65) Prior Publication Data

US 2015/0268704 A1 Sep. 24, 2015

(51) Int. Cl.
*G06F 1/20* (2006.01)
*F28F 21/00* (2006.01)
*H05K 7/20* (2006.01)

(52) U.S. Cl.
CPC . *G06F 1/20* (2013.01); *F28F 21/00* (2013.01); *H05K 7/20445* (2013.01)

(58) Field of Classification Search
CPC ..... H05K 7/20; H05K 7/472; H05K 7/20509; H05K 7/20963; G06F 1/20; H01L 23/36; H01L 23/373; H01L 23/3672; H01J 7/24
USPC ........................ 361/679.46, 679.54, 700–715, 361/719–724; 165/80.2, 80.3, 104.33, 185; 257/706, 727, 698, 676; 313/582–587, 313/41, 42, 46; 349/58, 64
See application file for complete search history.

(56) References Cited

U.S. PATENT DOCUMENTS

| | | | | |
|---|---|---|---|---|
| 5,550,326 A | * | 8/1996 | Kesel | H01L 23/3672 165/185 |
| 5,900,670 A | | 5/1999 | Schneider et al. | |
| 6,046,907 A | * | 4/2000 | Yamaguchi | H01L 23/3737 156/145 |
| 6,667,548 B2 | * | 12/2003 | O'Connor | H01L 23/3735 257/625 |
| 6,706,562 B2 | * | 3/2004 | Mahajan | H01L 23/36 257/E23.101 |
| 7,006,354 B2 | * | 2/2006 | Mochizuki | H01L 23/373 165/185 |
| 7,078,109 B2 | * | 7/2006 | Hill | H01L 23/4275 228/179.1 |
| 7,102,226 B2 | | 9/2006 | Fitzgerald et al. | |
| 7,315,451 B2 | * | 1/2008 | Kim | H05K 7/20963 313/46 |

(Continued)

OTHER PUBLICATIONS

International Search Report and Written Opinion—PCT/US2015/020567—ISA/EPO—Jun. 23, 2015.

*Primary Examiner* — Michail V Datskovskiy
(74) *Attorney, Agent, or Firm* — Loza & Loza, LLP

(57) ABSTRACT

Some implementations provide a multi-layer heat dissipating device that includes a first heat spreader layer, a first support structure, and a second heat spreader layer. The first heat spreader layer includes a first spreader surface and a second spreader surface. The first support structure includes a first support surface and a second support surface. The first support surface of the first support structure is coupled to the second spreader surface of the first heat spreader. The second heat spreader layer includes a third spreader surface and a fourth spreader surface. The third spreader surface of the second heat spreader layer is coupled to the second support surface of the first support structure. In some implementations, the first support structure is a thermally conductive adhesive layer. In some implementations, the first heat spreader layer has a first thermal conductivity, and the first support structure has a second thermal conductivity.

28 Claims, 12 Drawing Sheets

(56) References Cited

U.S. PATENT DOCUMENTS

| | | | |
|---|---|---|---|
| 7,362,042 B2 * | 4/2008 | Bae | H05K 7/20963 313/46 |
| 7,419,722 B2 * | 9/2008 | Ohta | H01L 23/373 165/185 |
| 7,485,495 B2 * | 2/2009 | Renavikar | H01L 23/4827 257/E23.08 |
| 7,787,252 B2 | 8/2010 | Mertol | |
| 8,058,724 B2 | 11/2011 | Refai-Ahmed | |
| 8,441,120 B1 | 5/2013 | Arcedera et al. | |
| 2005/0270746 A1 | 12/2005 | Reis | |
| 2007/0103849 A1 * | 5/2007 | Moon | H05K 7/20463 361/679.56 |
| 2007/0263352 A1 | 11/2007 | Jones et al. | |
| 2008/0271875 A1 * | 11/2008 | Lima | H01L 21/4882 165/80.3 |
| 2013/0077233 A1 | 3/2013 | Cao et al. | |
| 2013/0141866 A1 | 6/2013 | Refai-Ahmed | |

* cited by examiner

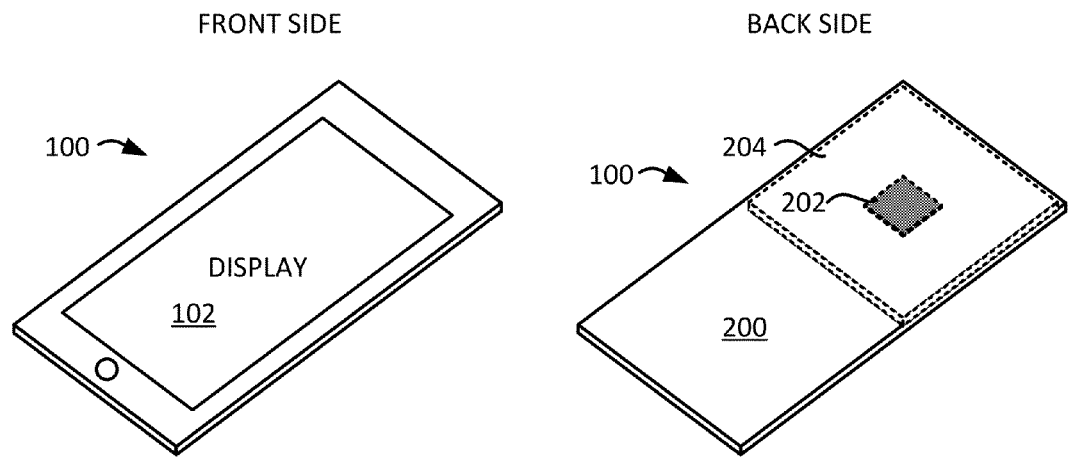
PRIOR ART FIG. 1
PRIOR ART FIG. 2
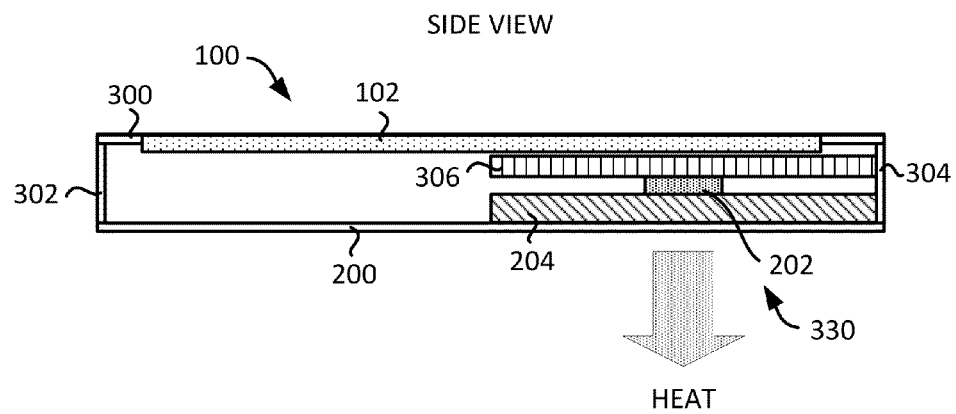
PRIOR ART FIG. 3

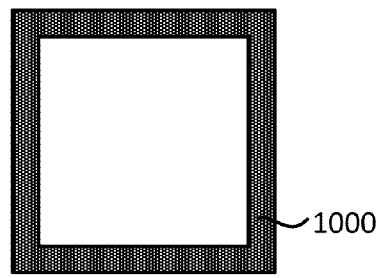
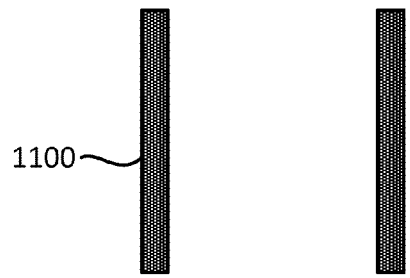
FIG. 10  FIG. 11
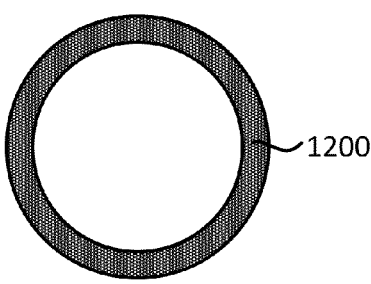
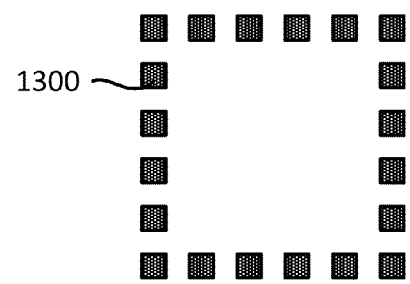
FIG. 12  FIG. 13
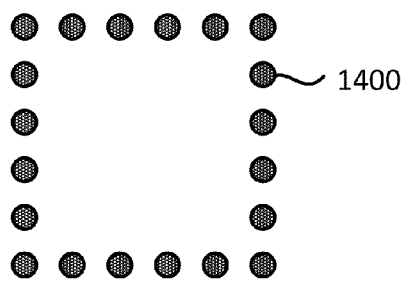
FIG. 14

MULTI-LAYER HEAT DISSIPATING APPARATUS FOR AN ELECTRONIC DEVICE

BACKGROUND

1. Field

Various features relate to a multi-layer heat dissipating apparatus for an electronic device.

2. Background

Electronic devices include internal components that generate heat. Some of these internal components include a central processing unit (CPU), a graphics processing unit (GPU) and/or memory. Some of the internal components can generate a lot of heat. Specifically, high performance CPU and/or GPU of an electronic device can generate a lot of heat, especially when performing data intensive operations (e.g., games, processing video).

To counter or dissipate the heat generated by the CPU and/or GPU, an electronic device may include a heat dissipating device, such as a heat spreader. FIGS. 1-3 illustrate an example of a mobile device that includes a heat spreader for dissipating heat generated by a chip. As shown in FIGS. 1 and 2, the mobile device 100 includes a display 102, a back side surface 200, a die 202, and a heat spreader 204. The die 202 and the heat spreader 204, which are both shown with dotted lines, are located inside the mobile device 100. The die 202 is coupled to a first surface of the heat spreader 204. A second surface of the heat spreader 204 is coupled to a first surface (e.g., inner surface) of the back side surface 200.

FIG. 3 illustrates a profile view of the mobile device 100 that includes the heat spreader 204. As shown in FIG. 3, the mobile device 100 includes the display 102, the back side surface 200, a front side surface 300, a bottom side surface 302, and a top side surface 304. FIG. 3 also illustrates a printed circuit board (PCB) 306, the die 202 and the heat spreader 204 inside the mobile device 100.

As further shown in FIG. 3, a first side of the die 202 is coupled to a first surface of the PCB 306. A second side of the die 202 is coupled to a first surface of the heat spreader 204. A second surface of the heat spreader 204 is coupled to a first surface (e.g., inner surface) of the back side surface 200. In this configuration, almost all of the heat that is generated by the die 202 is dissipate through the heat spreader 204 and the back side surface 200 of the mobile device. In many instances, this will cause the back side surface 200 to heat up to a temperature that is higher than was is comfortable and/or acceptable to a user (e.g., person) holding the mobile device. In some instances, the temperature of the back side surface 200 of the mobile device may be even hot enough to burn a user touching and/or holding the mobile device 100.

Therefore, there is a need for an improved method and design for efficiently dissipating heat from an electronic device (e.g., mobile device), while at the same time keeping the temperature of the outer surface of the electronic device within a threshold that is acceptable to a user of the electronic device.

SUMMARY

Various apparatus and methods described herein provide a multi-layer heat dissipating apparatus for an electronic device.

A first example provides a multi-layer heat dissipating device that includes a first heat spreader layer, a first support structure, and a second heat spreader layer. The first heat spreader layer includes a first spreader surface and a second spreader surface. The first support structure includes a first support surface and a second support surface. The first support surface of the first support structure is coupled to the second spreader surface of the first heat spreader. The second heat spreader layer includes a third spreader surface and a fourth spreader surface. The third spreader surface of the second heat spreader layer is coupled to the second support surface of the first support structure. According to an aspect, the first heat spreader layer has a first thermal conductivity, and the first support structure has a second thermal conductivity that is less than the first thermal conductivity.

According to one aspect, the first support structure comprises a thermally conductive adhesive layer.

According to an aspect, wherein the first support structure is coupled to the first heat spreader layer through a thermally conductive adhesive layer.

According to one aspect, the multi-layer heat dissipating device further includes (i) a second support structure comprising a third support surface and a fourth support surface, wherein the third support surface of the second support structure is coupled to the fourth spreader surface of the second heat spreader, and (ii) a third heat spreader layer comprising a fifth spreader surface and a sixth spreader surface, wherein the fifth spreader surface of the third heat spreader layer is coupled to the fourth support surface of the second support structure. In some implementations, the first support structure has a first size, and the second support structure has a second size that is greater than the first size. In some implementations, the second heat spreader layer has a third thermal conductivity, and the second support structure has a fourth thermal conductivity that is less than the third thermal conductivity.

According to an aspect, the first surface of the first heat spreader layer is coupled to a heat generating region and/or a region configured to generate heat.

According to one aspect, the first heat spreader layer includes a first set of fins.

According to an aspect, the first surface of the first heat spreader layer is coupled to at least one heat generating component and/or component configured to generate heat when active.

According to one aspect, the first heat spreader layer, the first support structure, and the second heat spreader layer are coupled together so as to form and encapsulate a gap in the multi-layer heat dissipating device.

According to an aspect, the first heat spreader layer is coupled to the heat generating component through a thermal interface material.

According to one aspect, the second surface of the second heat spreader layer is coupled to an inner portion of a first surface of an electronic device.

According to an aspect, the multi-layer heat dissipating device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes (i) a first heat spreading means for dissipating heat, (ii) a first supporting means coupled to the first heat spreading means, and (iii) a second heat spreading means for dissipating heat, wherein the second heat spreading means is coupled to the first supporting means.

According to an aspect, the first heat spreading means has a first thermal conductivity, and the first supporting means has a second thermal conductivity that is less than the first thermal conductivity.

According to one aspect, the first supporting means is coupled to the first heat spreading means through a thermally conductive adhesive means.

According to an aspect, the apparatus includes (i) a second supporting means coupled to the second heat spreading means, (ii) and a third heat spreading means for dissipating heat, wherein the third heat spreading means is coupled to the second supporting means.

According to one aspect, the first heat spreading means is coupled to a heat generating region and/or a region configured to generate heat. In some implementations, the region configured to generate heat includes an integrated package.

According to an aspect, the second heat spreading means is coupled to an inner portion of a first surface of an electronic device.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a device that includes a region configured to generate heat. The region includes an integrated device. The device includes a first heat spreader layer that includes a first spreader surface and a second spreader surface, wherein the first spreader surface of the first heat spreader layer is coupled to the region.

The device includes a first support structure that includes a first support surface and a second support surface, where the first support surface of the first support structure is coupled to the second spreader surface of the first heat spreader. The device includes a second heat spreader layer that includes a third spreader surface and a fourth spreader surface, where the third spreader surface of the second heat spreader layer is coupled to the second support surface of the first support structure.

According to an aspect, the device further includes an electronic device surface, where the electronic device surface is coupled to the fourth spreader surface of the second heat spreader.

According to one aspect, the device further includes a second support structure that includes a third support surface and a fourth support surface, where the third support surface of the second support structure is coupled to the fourth spreader surface of the second heat spreader. The device further includes a third heat spreader layer comprising a fifth spreader surface and a sixth spreader surface, where the fifth spreader surface of the third heat spreader layer is coupled to the fourth support surface of the second support structure. The device also includes an electronic device surface, where the electronic device surface is coupled to the sixth spreader surface of the third heat spreader.

According to an aspect, the first heat spreader layer has a first thermal conductivity, and the first support structure has a second thermal conductivity that is less than the first thermal conductivity.

According to one aspect, the first spreader surface of the first heat spreader layer is coupled to the integrated device.

According to an aspect, the region includes a printed circuit board (PCB).

According to one aspect, the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 1 illustrates a front view of a mobile device.

FIG. 2 illustrates a back view of a mobile device that includes a heat spreader.

FIG. 3 illustrates a profile view of a mobile device that includes a heat spreader.

FIG. 10 illustrates an example of a support structure of a multi-layer heat spreader.

FIG. 11 illustrates another example of a support structure of a multi-layer heat spreader.

FIG. 12 illustrates yet another example of a support structure of a multi-layer heat spreader.

FIG. 13 illustrates another example of a support structure of a multi-layer heat spreader.

FIG. 14 illustrates an example of a support structure of a multi-layer heat spreader.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may or may not be shown in block diagrams in order to avoid obscuring the aspects in unnecessary detail. In other instances, well-known circuits, structures and techniques may not be shown in detail in order not to obscure the aspects of the disclosure.

Overview

Some exemplary embodiments of this disclosure pertain to a multi-layer heat dissipating device that includes a first heat spreader layer, a first support structure, and a second heat spreader layer. The first heat spreader layer includes a first spreader surface and a second spreader surface. The first support structure includes a first support surface and a second support surface. The first support surface of the first support structure is coupled to the second spreader surface of the first heat spreader. The second heat spreader layer includes a third spreader surface and a fourth spreader surface. The third spreader surface of the second heat spreader layer is coupled to the second support surface of the first support structure. In some implementations, the first support structure is a thermally conductive adhesive layer. In some implementations, the first heat spreader layer has a first thermal conductivity, and the first support structure has a second thermal conductivity that is less than the first thermal conductivity. In some implementations, the first surface of the first heat spreader layer is coupled to a heat generating region and/or a region configured to generate heat. In some implementations, the heat generating region and/or region configured to generate heat includes one of at least an integrated package, a die, a die package, a system-on-chip (SoC) and/or a printed circuit board (PCB). In some implementations, the second surface of the second heat spreader layer is coupled to an inner portion of a first surface of an electronic device (e.g., mobile device).

Exemplary Multi-Layer Heat Dissipating Device

Figure 4:
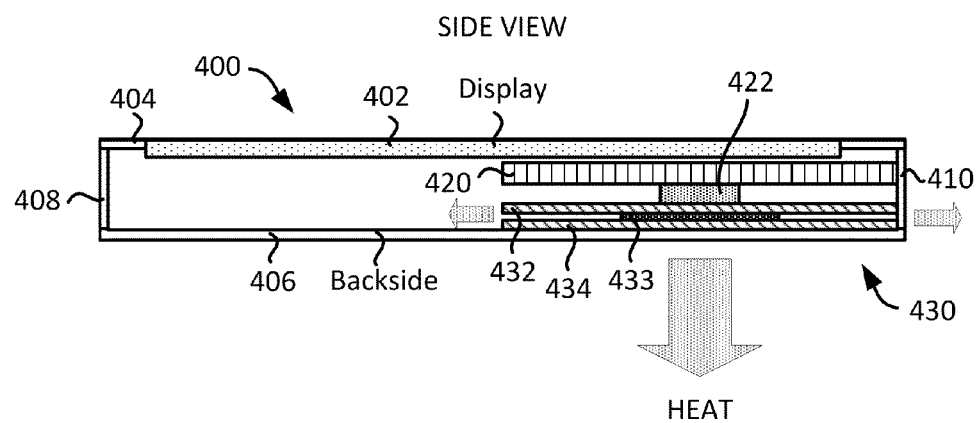
FIG. 4 illustrates a profile view of a mobile device that includes a multi-layer heat dissipating device in a first position.

FIG. 4 illustrates an electronic device 400 (e.g., mobile device) that includes a display 402, a front side surface 404, a back side surface 406, a bottom side surface 408, and a top side surface 410. The electronic device 400 also includes a printed circuit board (PCB) 420, an integrated device 422 (e.g., chip, die, die package), and a multi-layer heat dissipating device 430 (e.g., heat spreader).

In particular, FIG. 4 illustrates a multi-layer heat dissipating device 430 in physical contact with the back side surface 406 and the top side surface 410 of the electronic device 400. In some implementations, a multi-layer heat dissipating device may be near (e.g., in close proximity of) the back side surface 406 and/or the top side surface 410 of the electronic device 400, but not in physical contact with the back side surface 406 and/or the top side surface 410 of the electronic device 400. Such an example will further be described in FIG. 5.

Referring back to FIG. 4, in some implementations, the integrated device 422 is part of a heat generating component, a heat generating region, and/or a region configured to generate heat in the electronic device 400. In some implementations, the PCB 420 is part of a heat generating component, a heat generating region and/or region configured to generate heat in the electronic device 400.

The PCB 420 has a first surface and a second surface that is opposite to the first surface. The integrated device 422 has a first surface and a second surface that is opposite to the first surface. As shown in FIG. 4, the first surface of the integrated device 422 is coupled to the second surface of the PCB 420.

The multi-layer heat dissipating device 430 includes a first heat spreader layer 432, a first support structure 433, and a second heat spreader layer 434. The first heat spreader 432 has a first surface and a second surface that is opposite to the first surface. The first support structure 433 has a first surface and a second surface that is opposite to the first surface. The second heat spreader layer 434 has a first surface and a second surface that is opposite to the first surface.

The second surface of the first heat spreader layer 432 is coupled to the first surface of the first support structure 433. The second surface of the first support structure 433 is coupled to the first surface of the second heat spreader layer 434. In some implementations, the first support structure 433 is a thermally conductive adhesive layer.

As shown in FIG. 4, the first surface of the first heat spreader layer 432 is coupled to the integrated device 422 (e.g., second surface of the integrated device 422). In some implementations, the first heat spreader layer 432 is coupled to the integrated device 422 through a thermal interface material (e.g., thermally conductive adhesive). In some implementations, the first surface of the first heat spreader layer 432 is coupled to a heat generating region and/or a region configured to generate heat that includes the integrated device 422. In addition, the second surface of the second heat spreader layer 434 is coupled to a first surface (e.g., inner surface) of the back side surface 406 of the electronic device 400. In some implementations, a side portion of the first heat spreader layer 432, and/or a side portion of the second heat spreader layer 434 may be coupled (e.g., touching) to a first surface (e.g., inner surface) of the top side surface 410 of the electronic device 400.

As further shown in FIG. 4, the multi-layer heat dissipating device 430 is configured in such a way that heat from a heat generating region and/or region configured to generate heat (e.g., region that includes the integrated device 422) dissipates laterally and vertically from the heat dissipating device 430. For instance, heat from the heat generating region and/or region configured to generate heat may dissipate laterally from the first heat spreader layer 432 and the second heat spreader layer 434 into the inner region of the electronic device 400. In some implementations, heat from the heat generating region and/or region configured to generate heat may also dissipate through the top side surface 410. Heat from the heat generating region and/or region configured to generate heat may also dissipate through the back side surface 406.

As such, the multi-layer heat dissipating device 430, as shown in FIG. 4, is configured to spread out the dissipation of heat through different directions and/or surfaces, instead of entirely (or mostly) through the back side surface 406 of the electronic device 400. That is, some of the heat that would have otherwise dissipated through the back side surface 406 is now dissipated laterally to the inside of the electronic device 400 (thus reducing a hot spot peak temperature on the surface 406) and/or through the top side surface 410 of the electronic device. By doing this, it reduces and/or prevents the back side surface 406 of the electronic device 400 from reaching a temperature that is higher than a temperature threshold (e.g., temperature threshold that is acceptable or comfortable for a user of the electronic device 400).

In some implementations, the heat dissipating device 430 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer with a high thermal conductivity value coupled to a support structure (and/or adhesive materials) with a low thermal conductivity value. In some implementations, the materials for the heat spreader layer and the support structure are chosen to maximize the difference between the high thermal conductivity value of the heat spreader layer and the low thermal conductivity value of the support structure. Examples of thermal conductivity values will be further described below.

A support structure that has a low thermal conductivity provides greater thermal conductivity resistance than a heat spreader layer with a high thermal conductivity. This thermal conductivity resistance in the support structure encourages or forces the heat to substantially escape or dissipate through the heat spreader layer. Thus, heat from a heat generating region and/or region configured to generate heat substantially and laterally dissipates through the heat spreader layer. In some implementations, the support structure with the low thermal conductivity, in essence provides a vertical thermal resistance to the heat, which substantially shields the surface of the electronic device from the heat that is being generated from the heat generating region and/or region configured to generate heat (e.g., region comprising integrated circuit).

In addition, in some implementations, there are gaps (e.g., air gaps, vacuum) between the heat spreader layers, which further helps in reducing the vertical heat transfer in the multi-layer heat dissipating device. In some implementations, the gap is located within a region or volume surrounded by the first heat spreader layer 432, the support structure 433, and the second heat spreader layer 434.

Different implementations may use the same or different materials for the first heat spreader layer 432, the first support structure 433, and the second spreader layer 434. For example, the first heat spreader layer 432, the first support structure 433, and the second spreader layer 434 may be made of a material that includes one of at least metal, carbon, graphite and/or aluminum. In some implementations, the first heat spreader layer 432 has a first thermal conductivity value, the first support structure 433 has a second thermal conductivity value, and the second heat spreader layer 434 has a third thermal conductivity value. A particular thermal conductivity value of a particular material quantifies how well or how poorly a particular material conducts heat.

In some implementations, the material, the shape, and/or the thermal conductivity value of the first support structure 433 is chosen, such that heat from the heat generating region and/or region configured to generate heat (e.g., region that includes the integrated device 422) is primarily dissipated through the first heat spreader layer 432. In some implementations, the first support structure 433 is configured to provide thermal resistance (e.g., vertical thermal resistance of the heat dissipating device) of heat from the heat generating region and/or region configured to generate heat, which would cause more heat to dissipate through the first heat spreader layer 432 (e.g., more heat to dissipate laterally).

This approach of providing vertical thermal resistance is opposite and counterintuitive to conventional approaches of minimizing vertical thermal resistance in a heat dissipating device. In some implementations, the second thermal conductivity of the first support structure 433 is less than the first thermal conductivity of the first heat spreader layer 432. It should be noted that heat may still dissipate through the second heat spreader layer 434 and the back side surface 406, but not as much without the first support structure 433. Examples of different shapes for support structures are further described and illustrated in FIGS. 10-14.

In some implementations, the first support structure 433 is coupled to the first heat spreader layer 432 through an adhesive material (e.g., thermally conductive adhesive layer). Similarly, in implementations, the first support structure 433 is coupled to the second heat spreader 434 through an adhesive material (e.g., thermally conductive adhesive layer). Different implementations may use different materials for the first support structure 433 and/or the adhesive material. Examples of materials for the first support structure 433 and/or the adhesive material (e.g., thermally conductive adhesive layer) include an epoxy or porous material (e.g., material with air gaps).

In some implementations, the first support structure 433 and/or the adhesive material are configured to provide mechanical support for the multi-layer heat dissipating device 430 while minimizing the amount of heat conduction in the vertical direction of the heat dissipating device 430 and maximizing heat conduction in the lateral direction of the heat dissipating device 430. The use of one or more adhesive materials to couple a support structure to a heat spreader layer is not limited to the multi-layer heat dissipating device 430 of FIG. 4. In some implementations, the adhesive materials may be used to couple a support structure to a heat spreader layer in any of the multi-layer heat dissipating device described in the present disclosure.

The multi-layer heat dissipating device 430 has a first dimension, a second dimension, and a third dimension. In some implementations, the first dimension is a height of the multi-layer heat dissipating device, which may be along a Z-direction. In some implementations, the Z-direction is a vertical direction. In some implementations, a vertical direction is a direction along the multi-layer heat dissipating device 430 that traverses (e.g., perpendicularly) the heat spreader layer(s) and the support structure. In some implementations, a vertical direction is a direction that is perpendicular or orthogonal to a surface of the heat spreader having the biggest surface area. In some implementations, the vertical direction is perpendicular or orthogonal to the top surface of an integrated device (e.g., die, chip), and/or printed circuit board (PCB).

In some implementations, the second dimension is a length of the multi-layer heat dissipating device, which may be along a Y-direction. In some implementations, the Y-direction is a lateral direction. In some implementations, the second dimension is a radius of the multi-layer heat dissipating device, which may be along a Y-direction.

In some implementations, the third dimension is a width of the multi-layer heat dissipating device, which may be along an X-direction. In some implementations, the X-direction is a lateral direction.

Examples of X, Y, Z dimensions and/or directions for a multi-layer heat dissipating devices are shown in at least FIGS. 7, 9, 18 and 20.

In summary, FIG. 4 illustrates an example of an apparatus (e.g., multi-layer heat dissipating device 430, electronic device 400) that includes a first heat spreading means (e.g., first heat spreader layer 432), a first supporting means (e.g., first supporting structure 433), and a second heat spreading means (e.g., second heat spreader layer 434). In some implementations, at least one of the heat spreading means has a high thermal conductivity value. In some implementations, at least one of the supporting means has a low thermal conductivity value. Examples of high and low thermal conductivity values will be further described below.

Exemplary Materials and Thermal Conductivity Values

Different implementations may use materials with different thermal conductivity values for the support structures, the heat spreader layers, the thermal interface layers and/or the adhesive materials (e.g., thermally conductive adhesive layers).

In some implementations, the support structures (e.g., first support structure 433) are made of a material with a low thermal conductivity value. In some implementations, at least one of the support structures (e.g., first support structure 433) has a thermal conductivity value of about 0.3 watts per meter kelvin (W/m·k) or less. In some implementations, a low thermal conductivity value is about 0.3 watts per meter kelvin (W/m·k) or less.

In some implementations, at least one of the heat spreader layer is made of a material that includes one of at least metal, carbon, graphite and/or aluminum. In some implementations, at least one of the heat spreader layers is made of a material with a high thermal conductivity value. In some implementations, at least one of the heat spreader layer has a thermal conductivity value of about 300 W/m·k or higher. In some implementations, at least one of the heat spreader layer has a thermal conductivity value of about 500 W/m·k or higher (e.g., graphite). In some implementations, a high thermal conductivity value is about 300 W/m·k or higher.

In some implementations, a thermal interface layer is a material used to couple a heat spreader layer and an integrated device. Examples of thermal interfaces layers include solder, epoxy, metal filled attach, etc. . . . . . In some implementations, at least one of the thermal interface layers has a thermal conductivity value of about 1.5 W/m·k or less. In some implementations, at least one of the thermal interface layers has a thermal conductivity value of between about 0.7-1.5 W/m·k.

In some implementations, an adhesive material (e.g., thermally conductive adhesive layer) is a material used to couple a heat spreader layer and a support structure. In some implementations, at least one of the thermal interface layers has a thermal conductivity value that is about equal or greater than the thermal conductivity value of the support structure. In some implementations, at least one of the thermal interface layers has a thermal conductivity value that is about equal or less than the thermal conductivity value of the thermal interface layer.

It should be noted that the above thermal conductivity values are merely examples, and the materials used in a multi-layer heat dissipating device are not limited to materials that have these thermal conductivity values.

Exemplary Multi-Layer Heat Dissipating Device

FIG. 4 illustrates the multi-layer heat dissipating device 430 in a first location inside the electronic device 400. In particular, FIG. 4 illustrates a multi-layer heat dissipating device 430 in physical contact (e.g., touching) with the back side surface of the electronic device 430. However, the multi-layer heat dissipating device may be located in a different location inside the electronic device 400. In particular, in some implementations, there may be a gap (e.g., air gap) between the multi-layer heat dissipating device and one or more surfaces of the electronic device.

Figure 5:
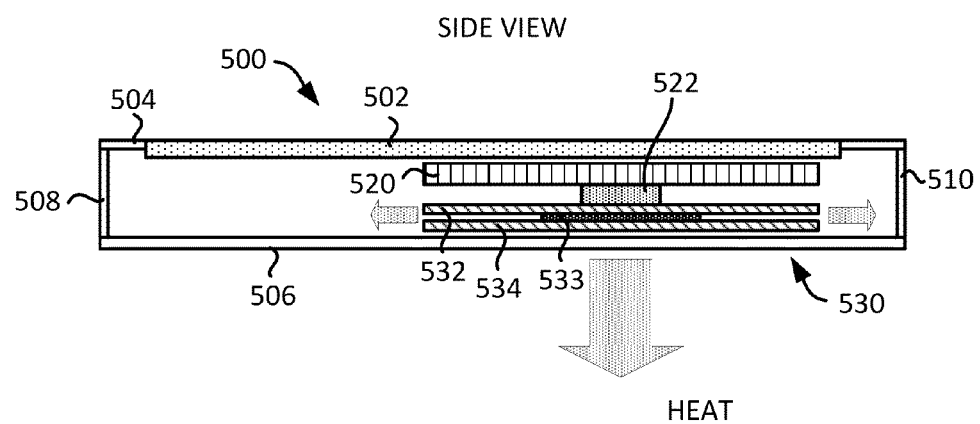
FIG. 5 illustrates a profile view of a mobile device that includes a multi-layer heat dissipating device in a second position.

FIG. 5 illustrates an electronic device 500 that includes a multi-layer heat dissipating device 530 in a second location inside the electronic device 500, where the second location is different than the first location of FIG. 4.

In some implementations, the multi-layer heat dissipating device 530 of FIG. 5 is similar to the multi-layer heat dissipating device 430 of FIG. 4, except that the multi-layer heat dissipating device 530 is positioned differently in the electronic device 500.

As shown in FIG. 5, the electronic device 500 (e.g., mobile device) includes a display 502, a front side surface 504, a back side surface 506, a bottom side surface 508, and a top side surface 510. The electronic device 500 also includes a printed circuit board (PCB) 520, an integrated device 522 (e.g., chip, die, die package), and the multi-layer heat dissipating device 530 (e.g., heat spreader).

In some implementations, the integrated device 522 is part of a heat generating component, a heat generating region, and/or a region configured to generate heat in the electronic device 500. In some implementations, the PCB 520 is part of a heat generating component, a heat generating region and/or region configured to generate heat in the electronic device 500.

The PCB 520 has a first surface and a second surface that is opposite to the first surface. The integrated device 522 has a first surface and a second surface that is opposite to the first surface. As shown in FIG. 5, the first surface of the integrated device 522 is coupled to the second surface of the PCB 520.

The multi-layer heat dissipating device 530 includes a first heat spreader layer 532, a first support structure 533, and a second heat spreader layer 534.

In some implementations, the heat dissipating device 530 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer with a high thermal conductivity value coupled to a support structure (and/or adhesive materials) with a low thermal conductivity value. In some implementations, the materials for the heat spreader layer and the support structure are chosen to maximize the difference between the high thermal conductivity value of the heat spreader layer and the low thermal conductivity value of the support structure.

In the example of FIG. 5, the side portion of the first heat spreader layer 532 and the side portion of the second heat spreader layer 534 do not touch the top side surface 510 of the electronic device 500. That is, there is a gap (e.g., air gap) between the first heat spreader layer 532 and the top side surface 510. Similarly, there is a gap (e.g., air gap) between the second heat spreader layer 534 and the top side surface 510. In addition, there is also a gap (e.g., air gap) between the second heat spreader layer 534 and the back side surface 506 of the electronic device 500. However, it should be noted that even though the first heat spreader layer 532 and the second heat spreader layer 534 do not touch the back side surface 506 and/or the top side surface 510, heat from a heat generating region and/or region configured to generate heat (e.g., region that includes the integrated device 522) may still dissipate through the back side surface 506 and/or the top side surface 510 of the electronic device 500. In some implementations, the gap between the multi-layer heat dissipating device 530 and the surface of the electronic device 500 provides enough thermal resistance to prevent the surface of the electronic device 500 from reaching a hotspot temperature or undesirable temperature.

In summary, FIG. 5 illustrates an example of an apparatus (e.g., multi-layer heat dissipating device 530, electronic device 500) that includes a first heat spreading means (e.g., first heat spreader layer 532), a first supporting means (e.g., first supporting structure 533), and a second heat spreading means (e.g., second heat spreader layer 534). In some implementations, at least one of the heat spreading means has a high thermal conductivity value. In some implementations, at least one of the supporting means has a low thermal conductivity value.

Figure 6:
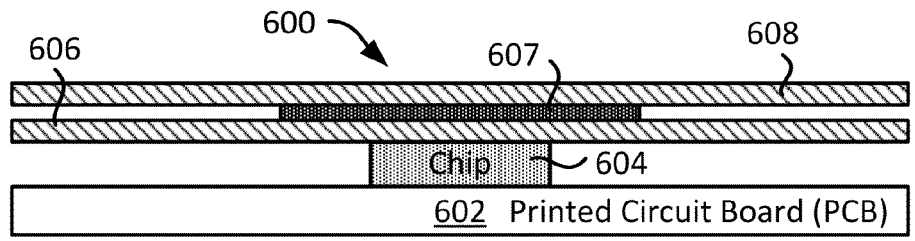
FIG. 6 illustrates a profile view of an integrated device coupled to a multi-layer heat dissipating device.

FIG. 6 illustrates a close-up view of a multi-layer heat dissipating device coupled to an integrated device. Specifically, FIG. 6 illustrates a multi-layer heat dissipating device 600 (e.g., heat spreader) coupled to heat generating components, a heat generating region and/or a region configured to generate heat. In some implementations, the heat generating components may include at least one of a printed circuit board (PCB) 602 and/or an integrated device 604 (e.g., chip, die, die package). In some implementations, a heat generating region may include at least one of a printed circuit board (PCB) 602 and/or an integrated device 604 (e.g., chip, die, die package). In some implementations, a region configured to generate heat may include at least one of a printed circuit board (PCB) 602 and/or an integrated device 604 (e.g., chip, die, die package).

The PCB 602 has a first surface and a second surface that is opposite to the first surface. The integrated device 604 has a first surface and a second surface that is opposite to the first surface. As shown in FIG. 6, the first surface of the integrated device 604 is coupled to the second surface of the PCB 602.

The multi-layer heat dissipating device 600 includes a first heat spreader layer 606, a first support structure 607, and a second heat spreader layer 608. The first heat spreader 606 has a first surface and a second surface that is opposite to the first surface. The first support structure 607 has a first surface and a second surface that is opposite to the first surface. The second heat spreader layer 608 has a first surface and a second surface that is opposite to the first surface.

The second surface of the first heat spreader layer 606 is coupled to the first surface of the first support structure 607. The second surface of the first support structure 607 is coupled to the first surface of the second heat spreader layer 608. In some implementations, the first support structure 607 is an adhesive layer (e.g., a thermally conductive adhesive layer).

In some implementations, the first surface of the first heat spreader layer 606 is coupled to the integrated device 604 (e.g., second surface of the integrated device 604) through a thermal interface material (e.g., thermally conductive adhesive). In some implementations, the first surface of the first heat spreader layer 606 is coupled to a heat generating region and/or a region configured to generate heat that includes the integrated device 604.

In some implementations, the heat dissipating device 600 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having heat spreader layer (e.g., heat spreader layer 606) with a high thermal conductivity value coupled to a support structure (e.g., support structure 607) with a low thermal conductivity value. In some implementations, the materials for the heat spreader layer and the support structure are chosen to maximize the difference between the high thermal conductivity value of the heat spreader layer and the low thermal conductivity value of the support structure.

Figure 7:
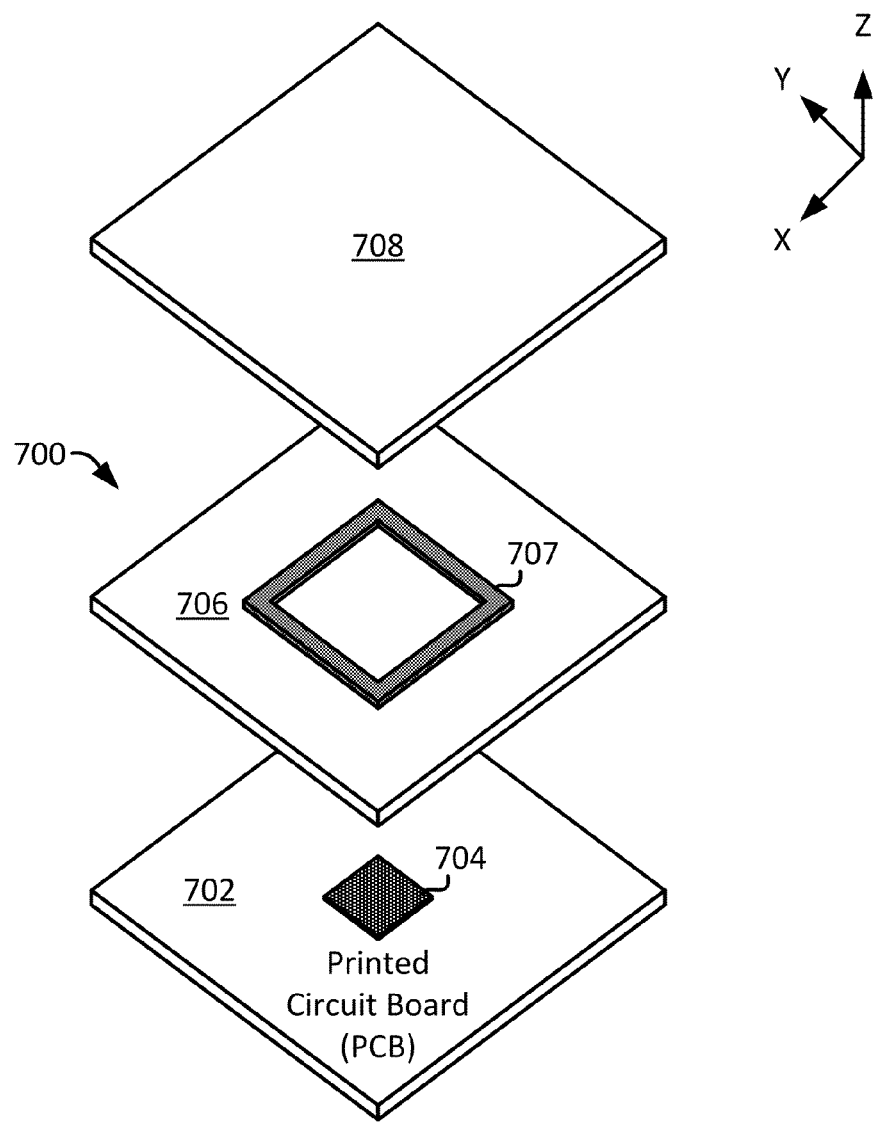
FIG. 7 illustrates a view of an integrated device and a multi-layer heat dissipating device.

FIG. 7 illustrates an assembly view of the different components of an integrated device and a multi-layer heat dissipating device. Specifically, FIG. 7 illustrates a multi-layer heat dissipating device 700 (e.g., heat spreader) and heat generating components, a heat generating region and/or region configured to generate heat. In some implementations, the heat generating components may include at least one of a printed circuit board (PCB) 702 and/or an integrated device 704 (e.g., chip, die, die package). In some implementations, a heat generating region may include at least one of a printed circuit board (PCB) 702 and/or an integrated device 704 (e.g., chip, die, die package). In some implementations, a region configured to generate heat may include at least one of a printed circuit board (PCB) 702 and/or an integrated device 704 (e.g., chip, die, die package).

The PCB 702 has a first surface and a second surface that is opposite to the first surface. The integrated device 704 has a first surface and a second surface that is opposite to the first surface. As shown in FIG. 7, the first surface of the integrated device 704 is coupled to the second surface of the PCB 702.

The multi-layer heat dissipating device 700 includes a first heat spreader layer 706, a first support structure 707, and a second heat spreader layer 708. The first heat spreader 706 has a first surface and a second surface that is opposite to the first surface. The first support structure 707 has a first surface and a second surface that is opposite to the first surface. The second heat spreader layer 708 has a first surface and a second surface that is opposite to the first surface.

The second surface of the first heat spreader layer 706 is coupled to the first surface of the first support structure 707. The second surface of the first support structure 707 is configured to couple to the first surface of the second heat spreader layer 708.

As shown in FIG. 7, the first surface of the first heat spreader layer 706 is configured to couple to the integrated device 704 (e.g., second surface of the integrated device 704). In some implementations, the first surface of the first heat spreader layer 706 is configured to couple to a heat generating region that includes the integrated device 704.

In some implementations, the heat dissipating device 700 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having heat spreader layer (e.g., heat spreader layer 706) with a high thermal conductivity value coupled to a support structure (e.g., support structure 707) with a low thermal conductivity value. In some implementations, the materials for the heat spreader layer and the support structure are chosen to maximize the difference between the high thermal conductivity value of the heat spreader layer and the low thermal conductivity value of the support structure.

FIGS. 4-7 illustrate a multi-layer heat dissipating device coupled to a single integrated device (e.g., chip). However, in some implementations, a multi-layer heat dissipating device may be coupled to more than one integrated device.

Figure 8:
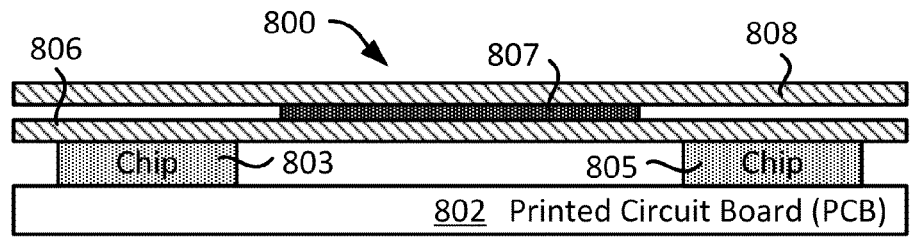
FIG. 8 illustrates a profile view of two integrated devices coupled to a multi-layer heat dissipating device.

FIG. 8 illustrates a close-up view of a multi-layer heat dissipating device coupled to two integrated devices. Specifically, FIG. 8 illustrates a multi-layer heat dissipating device 800 (e.g., heat spreader) coupled to heat generating components, a heat generating region and/or region configured to generate heat. In some implementations, the heat generating components may include at least one of a printed circuit board (PCB) 802, a first integrated device 803 (e.g., chip, die, die package), and/or a second integrated device 805. In some implementations, a heat generating region may include at least one of a printed circuit board (PCB) 802, a first integrated device 803 (e.g., chip, die, die package), and/or a second integrated device 805. In some implementations, a region configured to generate heat may include at least one of a printed circuit board (PCB) 802, a first integrated device 803 (e.g., chip, die, die package), and/or a second integrated device 805.

The PCB 802 has a first surface and a second surface that is opposite to the first surface. The first integrated device 803 has a first surface and a second surface that is opposite to the first surface. The second integrated device 805 has a first surface and a second surface that is opposite to the first surface. As shown in FIG. 8, the first surface of the first integrated device 803 is coupled to the second surface of the PCB 802. FIG. 8 also illustrates that the first surface of the second integrated device 805 is coupled to the second surface of the PCB 802.

The multi-layer heat dissipating device 800 includes a first heat spreader layer 806, a first support structure 807, and a second heat spreader layer 808. The first heat spreader 806 has a first surface and a second surface that is opposite to the first surface. The first support structure 807 has a first surface and a second surface that is opposite to the first surface. The second heat spreader layer 808 has a first surface and a second surface that is opposite to the first surface.

The second surface of the first heat spreader layer 806 is coupled to the first surface of the first support structure 807. The second surface of the first support structure 807 is coupled to the first surface of the second heat spreader layer 808. In some implementations, the first support structure 807 is an adhesive layer (e.g., a thermally conductive adhesive layer).

In some implementations, the first surface of the first heat spreader layer 806 is coupled to the first integrated device 803 (e.g., second surface of the integrated device 803) through a thermal interface material (e.g., thermally conductive adhesive). In some implementations, the first surface of the first heat spreader layer 806 is coupled to the second integrated device 805 (e.g., second surface of the second integrated device 805) through a thermal interface material (e.g., thermally conductive adhesive). In some implementations, the first surface of the first heat spreader layer 806 is coupled to a heat generating region that includes at least the first integrated device 803 and/or the second integrated device 805. In some implementations, the first integrated device 803 is a central processing unit (CPU) and the second integrated device 805 is a graphical processing unit (GPU).

In some implementations, the heat dissipating device 800 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 806) with a high thermal conductivity value coupled to a support structure (e.g., support structure 807) with a low thermal conductivity value. In some implementations, the materials for the heat spreader layer and the support structure are chosen to maximize the difference between the high thermal conductivity value of the heat spreader layer and the low thermal conductivity value of the support structure.

Figure 9:
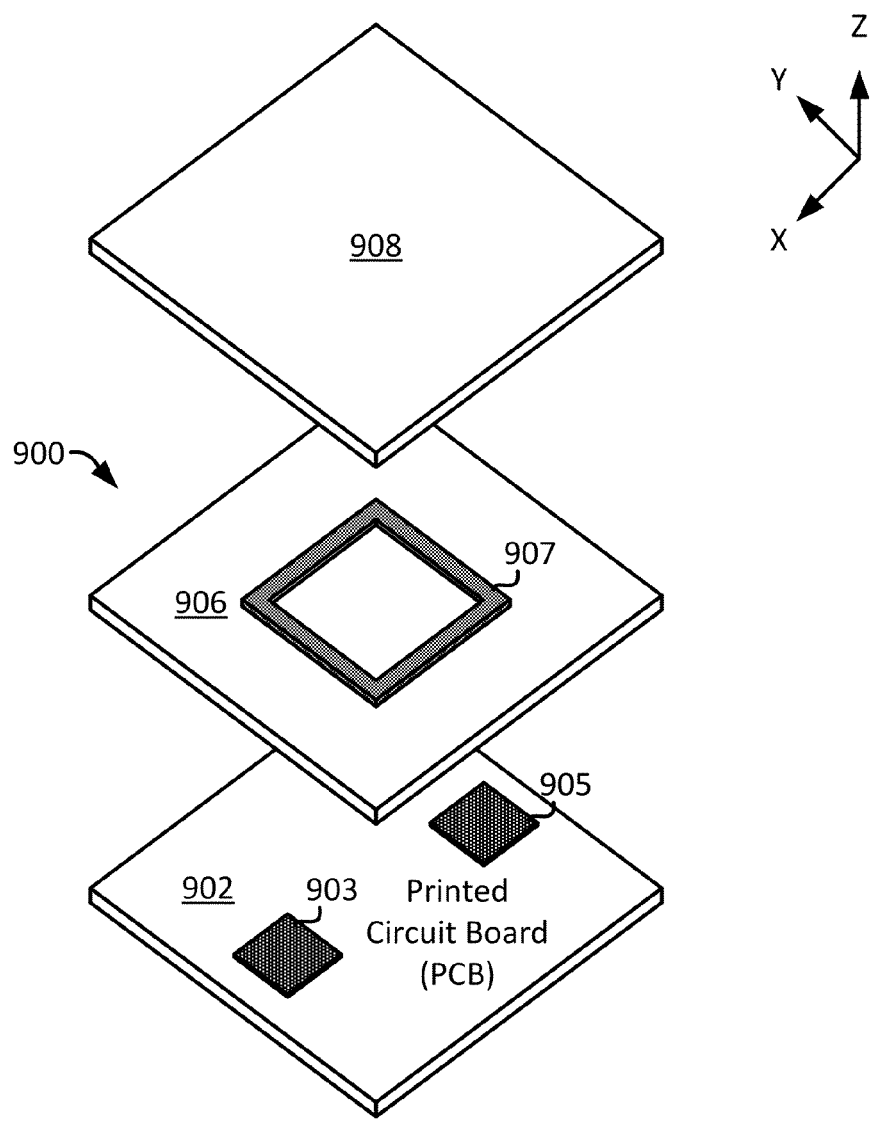
FIG. 9 illustrates a view of two integrated devices and a multi-layer heat dissipating device.

FIG. 9 illustrates an assembly view of the different components of an integrated device and a multi-layer heat dissipating device. Specifically, FIG. 9 illustrates a multi-layer heat dissipating device 900 (e.g., heat spreader) and heat generating components, a heat generating region and/or region configured to generate heat. In some implementations, the heat generating components may include at least one of a printed circuit board (PCB) 902, a first integrated device 903 (e.g., chip, die, die package), and/or a second integrated device 905. In some implementations, a heat generating region may include at least one of a printed circuit board (PCB) 902, a first integrated device 903 (e.g., chip, die, die package), and/or a second integrated device 905. In some implementations, a region configured to generate may include at least one of a printed circuit board (PCB) 902, a first integrated device 903 (e.g., chip, die, die package), and/or a second integrated device 905.

The PCB 902 has a first surface and a second surface that is opposite to the first surface. The first integrated device 903 has a first surface and a second surface that is opposite to the first surface. The second integrated device 905 has a first surface and a second surface that is opposite to the first surface. As shown in FIG. 9, the first surface of the first integrated device 903 is coupled to the second surface of the PCB 902. The first surface of the second integrated device 905 is also coupled to the second surface of the PCB 902.

The multi-layer heat dissipating device 900 includes a first heat spreader layer 906, a first support structure 907, and a second heat spreader layer 908. The first heat spreader 906 has a first surface and a second surface that is opposite to the first surface. The first support structure 907 has a first surface and a second surface that is opposite to the first surface. The second heat spreader layer 908 has a first surface and a second surface that is opposite to the first surface.

The second surface of the first heat spreader layer 906 is coupled to the first surface of the first support structure 907. The second surface of the first support structure 907 is configured to couple to the first surface of the second heat spreader layer 908.

As shown in FIG. 9, the first surface of the first heat spreader layer 906 is configured to couple to the first integrated device 903 (e.g., second surface of the integrated device 903) and the second integrated device 905 (e.g., second surface of the integrated device 905). In some implementations, the first surface of the first heat spreader layer 906 is configured to couple a heat generating region that includes the integrated device 903 and the integrated device 905.

In some implementations, the heat dissipating device 900 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 906) with a high thermal conductivity value coupled to a support structure (e.g., support structure 907) with a low thermal conductivity value. In some implementations, the materials for the heat spreader layer and the support structure are chosen to maximize the difference between the high thermal conductivity value of the heat spreader layer and the low thermal conductivity value of the support structure.

Exemplary Shapes for Support Structures

As described above, different implementations of a multi-layer heat dissipating device may have support structures with different sizes, shapes and/or configurations. FIGS. 10-14 illustrate examples of different sizes, shapes and/or configurations for a support structure of a multi-layer heat dissipating device. The support structures illustrated and described in FIGS. 10-14 may be implemented in any of the multi-layer heat dissipating device described in the present disclosure. It should be noted that the support structures show in FIGS. 10-14 are merely exemplary, and that other support structures with other sizes, shapes and/or configurations may be used.

FIG. 10 illustrates a support structure 1000 that has the shape of a square perimeter. FIG. 11 illustrates a support structure 1100 that includes a first rectangular structure and a second rectangular structure. FIG. 12 illustrates a support structure 1200 that has the shape of a circular ring (e.g., donut shape). FIG. 13 illustrates a support structure 1300 that includes several square columns arranged in a square perimeter. FIG. 14 illustrates a support structure 1400 that includes several circular columns arranged in a square perimeter.

In some implementations, the support structures 1000, 1100, 1200, 1300, and/or 1400 are a thermally conductive adhesive layer.

Exemplary Multi-Layer Heat Dissipating Device

Figure 15:
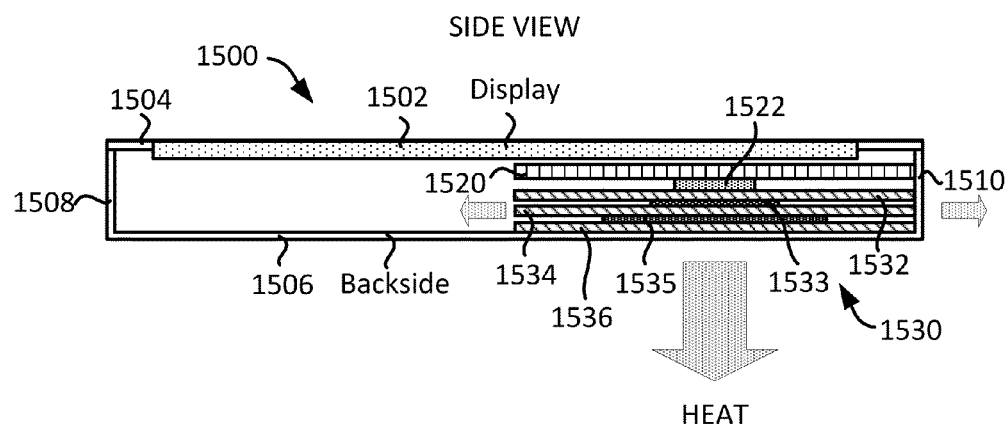
FIG. 15 illustrates a profile view of a mobile device that includes another multi-layer heat dissipating device in a first position.

In some implementations, a heat dissipating device may have more than two heat spreader layers. FIG. 15 illustrates an electronic device 1500 (e.g., mobile device) that includes a display 1502, a front side surface 1504, a back side surface 1506, a bottom side surface 1508, and a top side surface 1510. The electronic device 1500 also includes a printed circuit board (PCB) 1520, an integrated device 1522 (e.g., chip, die, die package), and a multi-layer heat dissipating device 1530 (e.g., heat spreader).

In particular, FIG. 15 illustrates a multi-layer heat dissipating device 1530 in physical contact with the back side surface 1506 and the top side surface 1510 of the electronic device 1500. In some implementations, a multi-layer heat dissipating device may be near (e.g., in close proximity of) the back side surface 1506 and/or the top side surface 1510 of the electronic device 1500, but not in physical contact (e.g., not touching) with the back side surface 1506 and/or the top side surface 1510 of the electronic device 1500. Such an example will further be described in FIG. 16.

Referring back to FIG. 15, in some implementations, the integrated device 1522 is part of a heat generating component, a heat generating region, and/or a region configured to generate heat in the electronic device 1500. In some implementations, the PCB 1520 is part of a heat generating component, a heat generating region, and/or a region configured to generate heat in the electronic device 1500.

The PCB 1520 has a first surface and a second surface that is opposite to the first surface. The integrated device 1522 has a first surface and a second surface that is opposite to the first surface. As shown in FIG. 15, the first surface of the integrated device 1522 is coupled to the second surface of the PCB 1520.

The multi-layer heat dissipating device 1530 includes a first heat spreader layer 1532, a first support structure 1533, a second heat spreader layer 1534, a second support structure 1535, and a third heat spreader layer 1536. The first heat spreader 1532 has a first surface and a second surface that is opposite to the first surface. The first support structure 1533 has a first surface and a second surface that is opposite to the first surface. The second heat spreader layer 1534 has a first surface and a second surface that is opposite to the first surface. The second support structure 1535 has a first surface and a second surface that is opposite to the first surface. The third heat spreader layer 1536 has a first surface and a second surface that is opposite to the first surface. FIG. 15 illustrates that the second support structure 1535 is greater (e.g., wider, longer, bigger diameter, bigger circumference) than the first support structure 1533.

The second surface of the first heat spreader layer 1532 is coupled to the first surface of the first support structure 1533. The second surface of the first support structure 1533 is coupled to the first surface of the second heat spreader layer 1534. The second surface of the second heat spreader layer 1534 is coupled to the first surface of the second support structure 1535. The second surface of the second support structure 1535 is coupled to a first surface of the third heat spreader layer 1536. In some implementations, the first support structure 1533 and/or the second support structure 1535 is a thermally conductive adhesive layer.

As shown in FIG. 15, the first surface of the first heat spreader layer 1532 is coupled to the integrated device 1522 (e.g., second surface of the integrated device 1522). In some implementations, the first heat spreader layer 1532 is coupled to the integrated device 1522 through a thermal interface material (e.g., thermally conductive adhesive). In some implementations, the first surface of the first heat spreader layer 1532 is coupled a heat generating region that includes the integrated device 1522. In addition, the second surface of the third heat spreader layer 1536 is coupled to a first surface (e.g., inner surface) of the back side surface 1506 of the electronic device 1500. In some implementations, a side portion of the first heat spreader layer 1532, a side portion of the second heat spreader layer 1534, and/or a side portion of the third heat spreader layer 1536 may be coupled to a first surface (e.g., inner surface) of the top side surface 1510 of the electronic device 1500.

As further shown in FIG. 15, the multi-layer heat dissipating device 1530 is configured in such a way that heat from a heat generating region (e.g., region that includes the integrated device 1522) dissipates laterally and vertically from the heat dissipating device 1530. For instance, heat from the heat generating region may dissipate laterally from the first heat spreader layer 1532, the second heat spreader layer 1534, and the third heat spreader layer 1536 into the inner region of the electronic device 1500. In some implementations, heat from the heat generating region may also dissipate through the top side surface 1510. Heat from the heat generating region may also dissipate through the back side surface 1506.

As such, the multi-layer heat dissipating device 1530, as shown in FIG. 15, is configured to spread out the dissipation of heat through different directions and/or surfaces, instead of entirely (or mostly) through the back side surface 1506 of the electronic device 1500. That is, some of the heat that would have otherwise dissipated through the back side surface 1506 is now dissipated to the inside of the electronic device 1500 and/or through the top side surface 1510 of the electronic device. By doing this, it reduces and/or prevents the back side surface 1506 of the electronic device 1500 from reaching a temperature that is higher than a temperature threshold (e.g., temperature threshold that is acceptable or comfortable for a user of the electronic device 1500).

In some implementations, the heat dissipating device 1500 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 1532) with a high thermal conductivity value coupled to a support structure (e.g., support structure 1533) with a low thermal conductivity value. In some implementations, the materials for the heat spreader layer and the support structure are chosen to maximize the difference between the high thermal conductivity value of the heat spreader layer and the low thermal conductivity value of the support structure.

Different implementations may use the same or different materials for the first heat spreader layer 1532, the first support structure 1533, the second heat spreader layer 1534, the second support structure 1535, and the third heat spreader layer 1536. For example, in some implementations, the first heat spreader layer 1532, the first support structure 1533, the second heat spreader layer 1534, the second support structure 1535, and/or the third heat spreader layer 1536 may be made of a material that includes one of at least metal and/or aluminum. In some implementations, the first heat spreader layer 1532 has a first thermal conductivity value, the first support structure 1533 has a second thermal conductivity value, the second heat spreader layer 1534 has a third thermal conductivity value, the second support structure 1535 has a fourth thermal conductivity value, and the third heat spreader layer 1536 has a fifth thermal conductivity value. A particular thermal conductivity value of a particular material quantifies how well or how poorly a particular material conducts heat.

In some implementations, the material, the shape, and/or the thermal conductivity value of the first support structure 1533 and/or the second support structure 1535 is chosen, such that heat from the heat generating region (e.g., region that includes the integrated device 1522) is primarily (or mostly) dissipated through the first heat spreader layer 1532 and/or the second heat spreader layer 1534. In some implementations, the first support structure 1533 is configured to provide thermal resistance (e.g., vertical thermal resistance of the heat dissipating device) of heat from the heat generating region, which would cause more heat to dissipate through the first heat spreader layer 1532 (e.g., heat to dissipate laterally). This approach of providing vertical thermal resistance is opposite and counterintuitive to conventional approaches of minimizing vertical thermal resistance in a heat dissipating device. In some implementations, the second thermal conductivity of the first support structure 1533 is less than the first thermal conductivity of the first heat spreader layer 1532.

In some implementations, the second support structure 1535 is configured to provide thermal resistance (e.g., vertical thermal resistance of the heat dissipating device) of heat from the heat generating region, which would cause more heat to dissipate through the second heat spreader layer 1534. In some implementations, the fourth thermal conductivity of the second support structure 1535 is less than the third thermal conductivity of the second heat spreader layer 1534.

It should be noted that heat may still dissipate through the third heat spreader layer 1536 and the back side surface 1506, but not as much without the first support structure 1533 and/or the second support structure 1535. Examples of different shapes for support structures were previously described and illustrated in FIGS. 10-14.

In summary, FIG. 15 illustrates an example of an apparatus (e.g., multi-layer heat dissipating device 1530, electronic device 1500) that includes a first heat spreading means (e.g., first heat spreader layer 1532), a first supporting means (e.g., first supporting structure 1533), a second heat spreading means (e.g., second heat spreader layer 1534), a second supporting means (e.g., second support structure 1535), and a third heat spreading means (e.g., third heat spreader layer 1536). In some implementations, at least one of the heat spreading means has a high thermal conductivity value. In some implementations, at least one of the supporting means has a low thermal conductivity value.

Exemplary Multi-Layer Heat Dissipating Device

FIG. 15 illustrates the multi-layer heat dissipating device 1530 in a first location inside the electronic device 1500. In particular, FIG. 15 illustrates a multi-layer heat dissipating device 1530 in physical contact with the back side surface of the electronic device 1530. However, the multi-layer heat dissipating device may be located in a different location inside the electronic device 1500. In particular, in some implementations, there may be a gap (e.g., air gap) between the multi-layer heat dissipating device and one or more surfaces of the electronic device.

Figure 16:
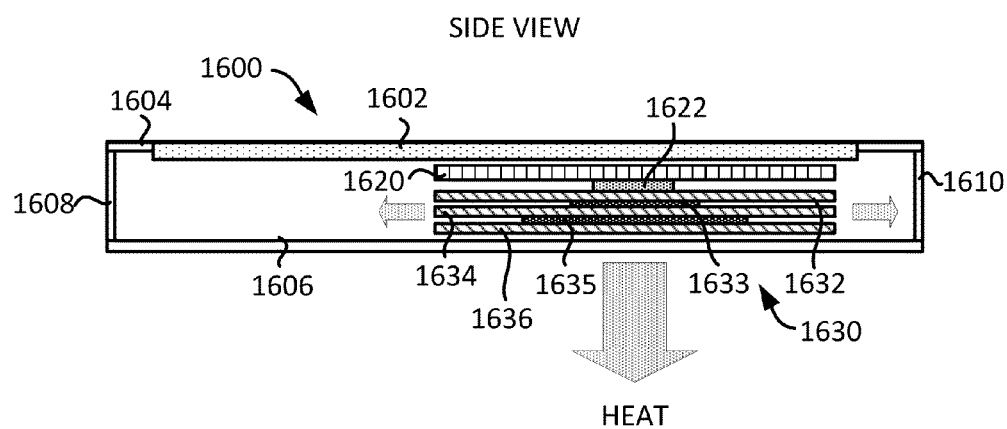
FIG. 16 illustrates a profile view of a mobile device that includes another multi-layer heat dissipating device in a second position.

FIG. 16 illustrates an electronic device 1600 that includes a multi-layer heat dissipating device 1630 in a second location inside the electronic device 1600, where the second location is different than the first location of FIG. 15.

In some implementations, the multi-layer heat dissipating device 1630 of FIG. 16 is similar to the multi-layer heat dissipating device 1530 of FIG. 15, except that the multi-layer heat dissipating device 1630 is positioned differently in the electronic device 1600.

FIG. 16 illustrates an electronic device 1600 (e.g., mobile device) that includes a display 1602, a front side surface 1604, a back side surface 1606, a bottom side surface 1608, and a top side surface 1610. The electronic device 1600 also includes a printed circuit board (PCB) 1620, an integrated device 1622 (e.g., chip, die, die package), and the multi-layer heat dissipating device 1630 (e.g., heat spreader).

In some implementations, the integrated device 1622 is part of a heat generating component, a heat generating region, and/or a region configured to generate heat in the electronic device 1600. In some implementations, the PCB 1620 is part of a heat generating component, a heat generating region, and/or a region configured to generate heat in the electronic device 1600.

The multi-layer heat dissipating device 1630 includes a first heat spreader layer 1632, a first support structure 1633, a second heat spreader layer 1634, a second support structure 1635, and a third heat spreader layer 1636. In some implementations, the first support structure 1633 and/or the second support structure 1635 is a thermally conductive adhesive layer.

In some implementations, the heat dissipating device 1630 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer with a high thermal conductivity value coupled to a support structure (and/or adhesive materials) with a low thermal conductivity value. In some implementations, the materials for the heat spreader layer and the support structure are chosen to maximize the difference between the high thermal conductivity value of the heat spreader layer and the low thermal conductivity value of the support structure.

FIG. 16 illustrates that the electronic device 1600 that includes the multi-layer heat dissipating device 1630 in a second location inside the electronic device 1600, where the second location is different than the first location of FIG. 15. In this example, the side portion of the first heat spreader layer 1632, the side portion of the second heat spreader layer 1634, and the third heat spreader 1636 do not touch the top side surface 1610 of the electronic device 1600. Similarly, the third heat spreader 1636 does not touch the back side surface 1606 of the electronic device 1600. That is, there is a gap (e.g., air gap) between the third heat spreader 1636 and the surface of the electronic device 1600. However, it should be noted that even though the first heat spreader layer 1632, the second heat spreader layer 1634, and the third heat spreader 1636 do not touch the back side surface 1606 and/or the top side surface 1610, heat from a heat generating region (e.g., region that includes the integrated device 1622) may still dissipate through the back side surface 1606 and/or the top side surface 1610 of the electronic device 1600.

In summary, FIG. 16 illustrates an example of an apparatus (e.g., multi-layer heat dissipating device 1630, electronic device 1600) that includes a first heat spreading means (e.g., first heat spreader layer 1632), a first supporting means (e.g., first supporting structure 1633), a second heat spreading means (e.g., second heat spreader layer 1634), a second supporting means (e.g., second support structure 1635), and a third heat spreading means (e.g., third heat spreader layer 1636). In some implementations, at least one of the heat spreading means has a high thermal conductivity value. In some implementations, at least one of the supporting means has a low thermal conductivity value.

Figure 17:
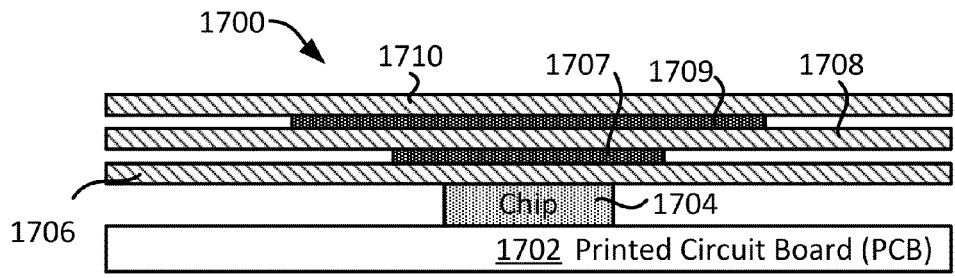
FIG. 17 illustrates a profile view of another integrated device coupled to a multi-layer heat dissipating device.

FIG. 17 illustrates a close-up view of a multi-layer heat dissipating device coupled to an integrated device. Specifically, FIG. 17 illustrates a multi-layer heat dissipating device 1700 (e.g., heat spreader) coupled to heat generating components and/or a heat generating region. In some implementations, the heat generating components may include at least one of a printed circuit board (PCB) 1702 and/or an integrated device 1704 (e.g., chip, die, die package). In some implementations, a heat generating region may include at least one of a printed circuit board (PCB) 1702 and/or an integrated device 1704 (e.g., chip, die, die package).

The PCB 1702 has a first surface and a second surface that is opposite to the first surface. The integrated device 1704 has a first surface and a second surface that is opposite to the first surface. As shown in FIG. 17, the first surface of the integrated device 1704 is coupled to the second surface of the PCB 1702.

The multi-layer heat dissipating device 1700 includes a first heat spreader layer 1706, a first support structure 1707, a second heat spreader layer 1708, a second support structure 1709, and a third heat spreader layer 1710. The first heat spreader 1706 has a first surface and a second surface that is opposite to the first surface. The first support structure 1707 has a first surface and a second surface that is opposite to the first surface. The second heat spreader layer 1708 has a first surface and a second surface that is opposite to the first surface. The second support structure 1709 has a first surface and a second surface that is opposite to the first surface. The third heat spreader layer 1710 has a first surface and a second surface that is opposite to the first surface. FIG. 17 illustrates that the second support structure 1709 is greater (e.g., wider, longer, bigger diameter, bigger circumference) than the first support structure 1707.

The second surface of the first heat spreader layer 1706 is coupled to the first surface of the first support structure 1707. The second surface of the first support structure 1707 is coupled to the first surface of the second heat spreader layer 1708. The second surface of the second heat spreader layer 1708 is coupled to the first surface of the second support structure 1709. The second surface of the second support structure 1709 is coupled to a first surface of the third heat spreader layer 1710. In some implementations, the first support structure 1707 and/or the second support structure 1709 is a thermally conductive adhesive layer.

As shown in FIG. 17, the first surface of the first heat spreader layer 1706 is coupled to the integrated device 1704 (e.g., second surface of the integrated device 1704). In some implementations, the first heat spreader layer 1706 is coupled to the integrated device 1704 through a thermal interface material (e.g., thermally conductive adhesive). In some implementations, the first surface of the first heat spreader layer 1706 is coupled to a heat generating region that includes the integrated device 1704.

In some implementations, the heat dissipating device 1700 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 1706) with a high thermal conductivity value coupled to a support structure (e.g., support structure 1707) with a low thermal conductivity value. In some implementations, the materials for the heat spreader layer and the support structure are chosen to maximize the difference between the high thermal conductivity value of the heat spreader layer and the low thermal conductivity value of the support structure.

Figure 18:
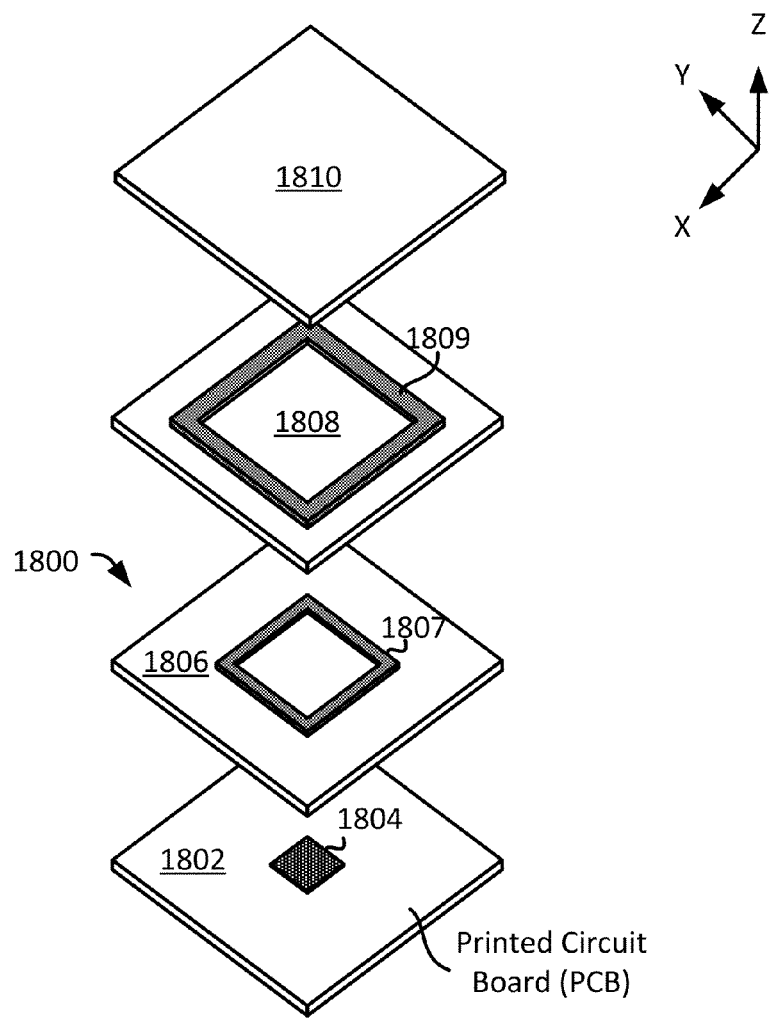
FIG. 18 illustrates a view of an integrated device and a multi-layer heat dissipating device.

FIG. 18 illustrates an assembly view of the different components of an integrated device and a multi-layer heat dissipating device. Specifically, FIG. 18 illustrates a multi-layer heat dissipating device 1800 (e.g., heat spreader) and heat generating components and/or a heat generating region. In some implementations, the heat generating components may include at least one of a printed circuit board (PCB) 1802 and/or an integrated device 1804 (e.g., chip, die, die package). In some implementations, a heat generating region may include at least one of a printed circuit board (PCB) 1802 and/or an integrated device 1804 (e.g., chip, die, die package).

The PCB 1802 has a first surface and a second surface that is opposite to the first surface. The integrated device 1804 has a first surface and a second surface that is opposite to the first surface. As shown in FIG. 18, the first surface of the integrated device 1804 is coupled to the second surface of the PCB 1802.

The multi-layer heat dissipating device 1800 includes a first heat spreader layer 1806, a first support structure 1807, a second heat spreader layer 1808, a second support structure 1809, and a third heat spreader layer 1810. The first heat spreader 1806 has a first surface and a second surface that is opposite to the first surface. The first support structure 1807 has a first surface and a second surface that is opposite to the first surface. The second heat spreader layer 1808 has a first surface and a second surface that is opposite to the first surface. The second support structure 1809 has a first surface and a second surface that is opposite to the first surface. The third heat spreader layer 1810 has a first surface and a second surface that is opposite to the first surface. FIG. 18 illustrates that the second support structure 1809 is greater (e.g., wider, longer, bigger diameter, bigger circumference) than the first support structure 1807.

The second surface of the first heat spreader layer 1806 is coupled to the first surface of the first support structure 1807. The second surface of the first support structure 1807 is configured to couple to the first surface of the second heat spreader layer 1808. The second surface of the second heat spreader layer 1808 is coupled to the first surface of the second support structure 1809. The second surface of the second support structure 1809 is configured to couple to the first surface of the third heat spreader layer 1810.

As shown in FIG. 18, the first surface of the first heat spreader layer 1806 is configured to couple to the integrated device 1804 (e.g., second surface of the integrated device 1804). In some implementations, the first surface of the first heat spreader layer 1806 is configured to couple to a heat generating region that includes the integrated device 1804.

In some implementations, the heat dissipating device 1800 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 1806) with a high thermal conductivity value coupled to a support structure (e.g., support structure 1807) with a low thermal conductivity value. In some implementations, the materials for the heat spreader layer and the support structure are chosen to maximize the difference between the high thermal conductivity value of the heat spreader layer and the low thermal conductivity value of the support structure.

Exemplary Multi-Layer Heat Dissipating Device

Figure 19:
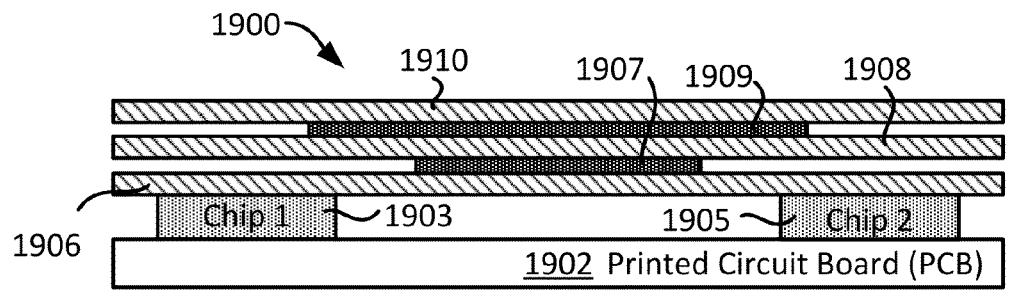
FIG. 19 illustrates a profile view of two integrated devices coupled to a multi-layer heat dissipating device.

FIG. 19 illustrates a close-up view of a multi-layer heat dissipating device coupled to two integrated devices. Specifically, FIG. 19 illustrates a multi-layer heat dissipating device 1900 (e.g., heat spreader) coupled to heat generating components, a heat generating region and/or region configured to generate heat. In some implementations, the heat generating components may include at least one of a printed circuit board (PCB) 1902, a first integrated device 1903 (e.g., chip, die, die package) and/or a second integrated device 1905. In some implementations, a heat generating region may include at least one of a printed circuit board (PCB) 1902 and/or the integrated devices 1903 and/or 1905 (e.g., chip, die, die package).

The PCB 1902 has a first surface and a second surface that is opposite to the first surface. The first integrated device 1903 has a first surface and a second surface that is opposite to the first surface. As shown in FIG. 19, the first surface of the first integrated device 1903 is coupled to the second surface of the PCB 1902. The second integrated device 1905 has a first surface and a second surface that is opposite to the first surface. As shown in FIG. 19, the first surface of the second integrated device 1905 is coupled to the second surface of the PCB 1902.

The multi-layer heat dissipating device 1900 includes a first heat spreader layer 1906, a first support structure 1907, a second heat spreader layer 1908, a second support structure 1909, and a third heat spreader layer 1910. The first heat spreader 1906 has a first surface and a second surface that is opposite to the first surface. The first support structure 1907 has a first surface and a second surface that is opposite to the first surface. The second heat spreader layer 1908 has a first surface and a second surface that is opposite to the first surface. The second support structure 1909 has a first surface and a second surface that is opposite to the first surface. The third heat spreader layer 1910 has a first surface and a second surface that is opposite to the first surface. FIG. 19 illustrates that the second support structure 1909 is greater (e.g., wider, longer, bigger diameter, bigger circumference) than the first support structure 1907.

The second surface of the first heat spreader layer 1906 is coupled to the first surface of the first support structure 1907. The second surface of the first support structure 1907 is coupled to the first surface of the second heat spreader layer 1908. The second surface of the second heat spreader layer 1908 is coupled to the first surface of the second support structure 1909. The second surface of the second support structure 1909 is coupled to a first surface of the third heat spreader layer 1910. In some implementations, the first support structure 1907 and/or the second support structure 1909 is a thermally conductive adhesive layer.

As shown in FIG. 19, the first surface of the first heat spreader layer 1906 is coupled to the first integrated device 1903 (e.g., second surface of the integrated device 1903) and the second integrated device 1905. In some implementations, the first heat spreader layer 1906 is coupled to the first integrated device 1903 and/or the second integrated device 1905 through a thermal interface material (e.g., thermally conductive adhesive). In some implementations, the first surface of the first heat spreader layer 1906 is coupled to a heat generating region that includes the first integrated device 1903 and/or the second integrated device 1905.

In some implementations, the heat dissipating device 1900 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 1906) with a high thermal conductivity value coupled to a support structure (e.g., support structure 1907) with a low thermal conductivity value. In some implementations, the materials for the heat spreader layer and the support structure are chosen to maximize the difference between the high thermal conductivity value of the heat spreader layer and the low thermal conductivity value of the support structure.

Figure 20:
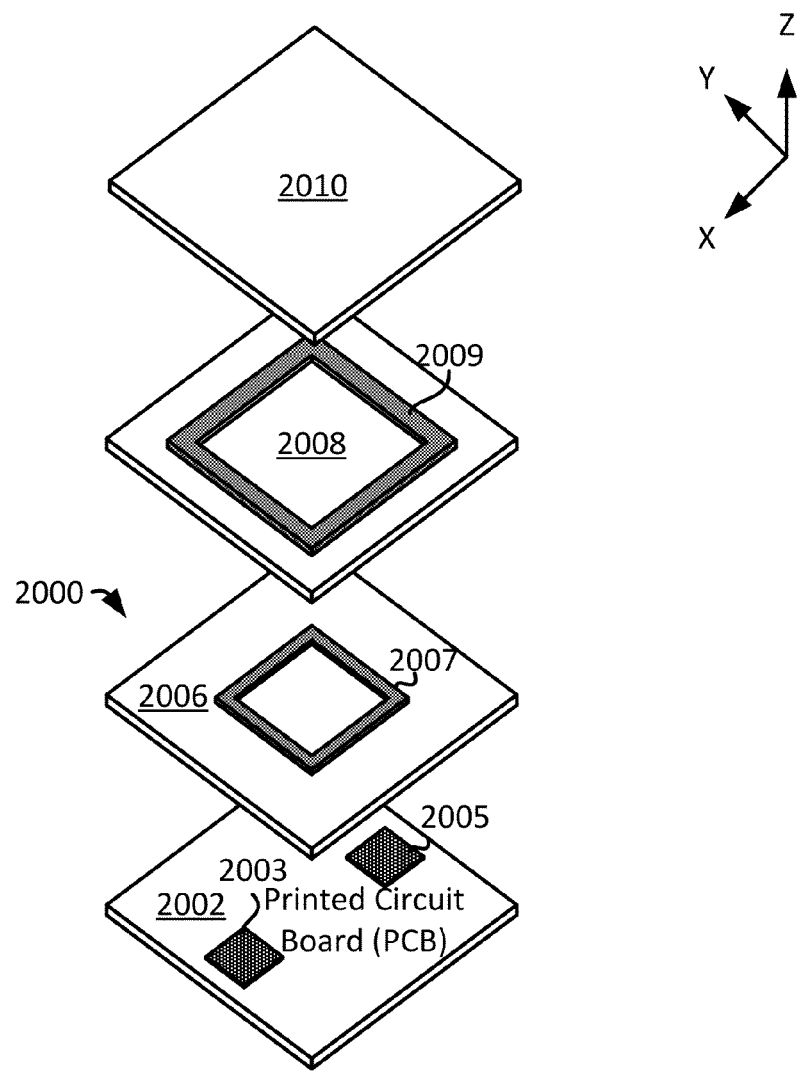
FIG. 20 illustrates a view of two integrated devices and a multi-layer heat dissipating device.

FIG. 20 illustrates an assembly view of the different components of an integrated device and a multi-layer heat dissipating device. Specifically, FIG. 20 illustrates a multi-layer heat dissipating device 2000 (e.g., heat spreader) and heat generating components and/or a heat generating region. In some implementations, the heat generating components may include at least one of a printed circuit board (PCB) 2002, a first integrated device 2003 and/or a second integrated device 2005 (e.g., chip, die, die package). In some implementations, a heat generating region may include at least one of a printed circuit board (PCB) 2002, the first integrated device 2003 and/or the second integrated device 2005 (e.g., chip, die, die package).

The PCB 2002 has a first surface and a second surface that is opposite to the first surface. The first integrated device 2003 has a first surface and a second surface that is opposite to the first surface. As shown in FIG. 20, the first surface of the first integrated device 2003 is coupled to the second surface of the PCB 2002. The second integrated device 2005 has a first surface and a second surface that is opposite to the first surface. As shown in FIG. 20, the first surface of the second integrated device 2005 is coupled to the second surface of the PCB 2002.

The multi-layer heat dissipating device 2000 includes a first heat spreader layer 2006, a first support structure 2007, a second heat spreader layer 2008, a second support structure 2009, and a third heat spreader layer 2010. The first heat spreader 2006 has a first surface and a second surface that is opposite to the first surface. The first support structure 2007 has a first surface and a second surface that is opposite to the first surface. The second heat spreader layer 2008 has a first surface and a second surface that is opposite to the first surface. The second support structure 2009 has a first surface and a second surface that is opposite to the first surface. The third heat spreader layer 2010 has a first surface and a second surface that is opposite to the first surface. FIG. 20 illustrates that the second support structure 2009 is greater (e.g., wider, longer, bigger diameter, bigger circumference) than the first support structure 2007.

The second surface of the first heat spreader layer 2006 is coupled to the first surface of the first support structure 2007. The second surface of the first support structure 2007 is configured to couple to the first surface of the second heat spreader layer 2008. The second surface of the second heat spreader layer 2008 is coupled to the first surface of the second support structure 2009. The second surface of the second support structure 2009 is configured to couple to the first surface of the third heat spreader layer 2010.

As shown in FIG. 20, the first surface of the first heat spreader layer 2006 is configured to couple to the first integrated device 2003 (e.g., second surface of the integrated device 2003) and/or the second integrated device 2005. In some implementations, the first surface of the first heat spreader layer 2006 is configured to couple to a heat generating region that includes the first integrated device 2003 and/or the second integrated device 2005.

In some implementations, the heat dissipating device 2000 is configured in such a way as to maximize lateral heat dissipation and minimize vertical heat dissipation (or at least reduce vertical heat dissipation), which would reduce the likelihood of hotspot peak temperatures on the surface of the electronic device. In some implementations, this can be achieved by having at least one heat spreader layer (e.g., heat spreader layer 2006) with a high thermal conductivity value coupled to a support structure (e.g., support structure 2007) with a low thermal conductivity value. In some implementations, the materials for the heat spreader layer and the support structure are chosen to maximize the difference between the high thermal conductivity value of the heat spreader layer and the low thermal conductivity value of the support structure.

Exemplary Method for Fabricating a Multi-Layer Heat Dissipating Device

Figure 21:
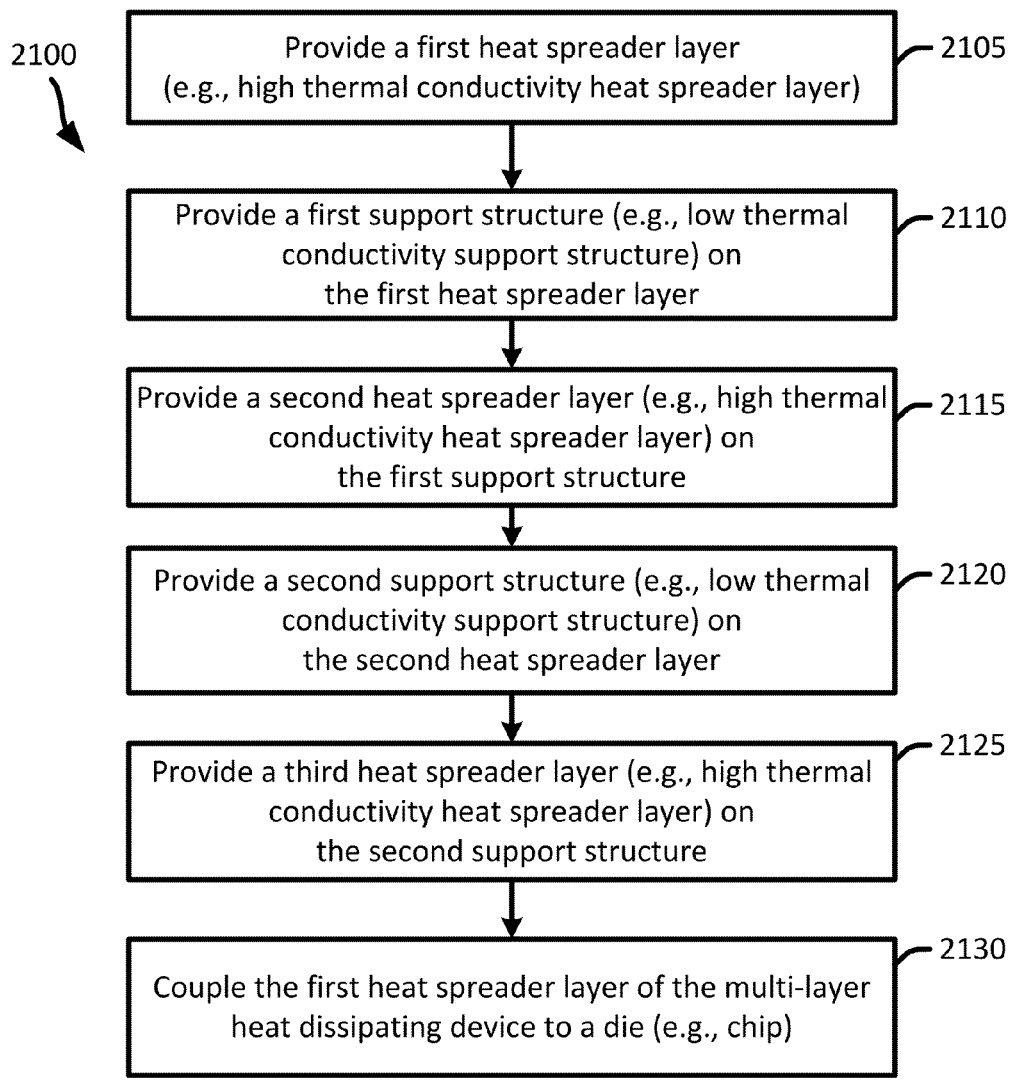
FIG. 21 illustrates a flow diagram of a method for assembling a multi-layer heat spreader.

FIG. 21 illustrates an exemplary method for providing/fabricating a multi-layer heat dissipating device in some implementations. The method of FIG. 21 may be used to fabricate any of the multi-layer heat dissipating devices described in the present disclosure.

As shown in FIG. 21, the method provides (at 2105) a first heat spreader layer. The first heat spreader layer includes a first surface and a second surface opposite of the first surface. In some implementations, providing the first heat spreader layer includes fabricating/manufacturing the first heat spreader layer. In some implementations, the first heat spreader layer is a high thermal conductivity heat spreader layer. The method also provides (at 2110) a first support structure on a first surface of the first heat spreader layer. In some implementations, providing the first support structure includes fabricating/manufacturing and coupling (e.g., placing) the first support structure on the first surface of the first heat spreader layer. In some implementations, an adhesive layer (e.g., thermally conductive adhesive) is used to couple the first support structure on the first heat spreader layer. In some implementations, the first support structure is a thermally conductive adhesive layer. In some implementations, the first support structure is a low thermal conductivity support structure.

The method provides (at 2115) a second heat spreader layer on the first support structure. In some implementations, providing the second heat spreader layer includes fabricating/manufacturing and coupling (e.g., placing) the second heat spreader layer on the first support structure. In some implementations, an adhesive layer (e.g., thermally conductive adhesive) is used to couple the second heat spreader layer to the first support structure. In some implementations, the second heat spreader layer is a high thermal conductivity heat spreader layer.

The method further provides (at 2120) a second support structure on the second heat spreader layer. In some implementations, providing the second support structure includes fabricating/manufacturing and coupling (e.g., placing) the second support structure on the second heat spreader layer. In some implementations, the second support structure is greater (e.g., wider, longer, bigger circumference, bigger perimeter) than the first support structure. In some implementations, an adhesive layer (e.g., thermally conductive adhesive) is used to couple the second support structure to the second heat spreader layer. In some implementations, the second support structure is a thermally conductive adhesive layer. In some implementations, the second support structure is a low thermal conductivity support structure.

The method provides (at 2125) a third heat spreader layer on the second support structure. In some implementations, providing the third heat spreader layer includes fabricating/manufacturing and coupling (e.g., placing) the third heat spreader layer on the second support structure. In some implementations, an adhesive layer (e.g., thermally conductive adhesive) is used to couple the third heat spreader layer to the second support structure. In some implementations, the third heat spreader layer is a high thermal conductivity heat spreader layer.

In some implementations, the first heat spreader layer, the first support structure, the second heat spreader layer, the second support structure, and the third heat spreader layer form a multi-layer heat dissipating device that can be implemented in an electronic device.

In some implementations, the method may further couple (at 2130) the first heat spreader layer of the multi-layer heat dissipating device to heat generating components, a heat generating region and/or region configured to generate heat. In some implementations, the heat generating components includes an integrated device (e.g., die, die package) and/or printed circuit board (PCB). In some implementations, the heat generating region includes an integrated device (e.g., die, die package) and/or printed circuit board (PCB).

Temperature Profiles of Electronic Device

Figures 22, 23, 24:
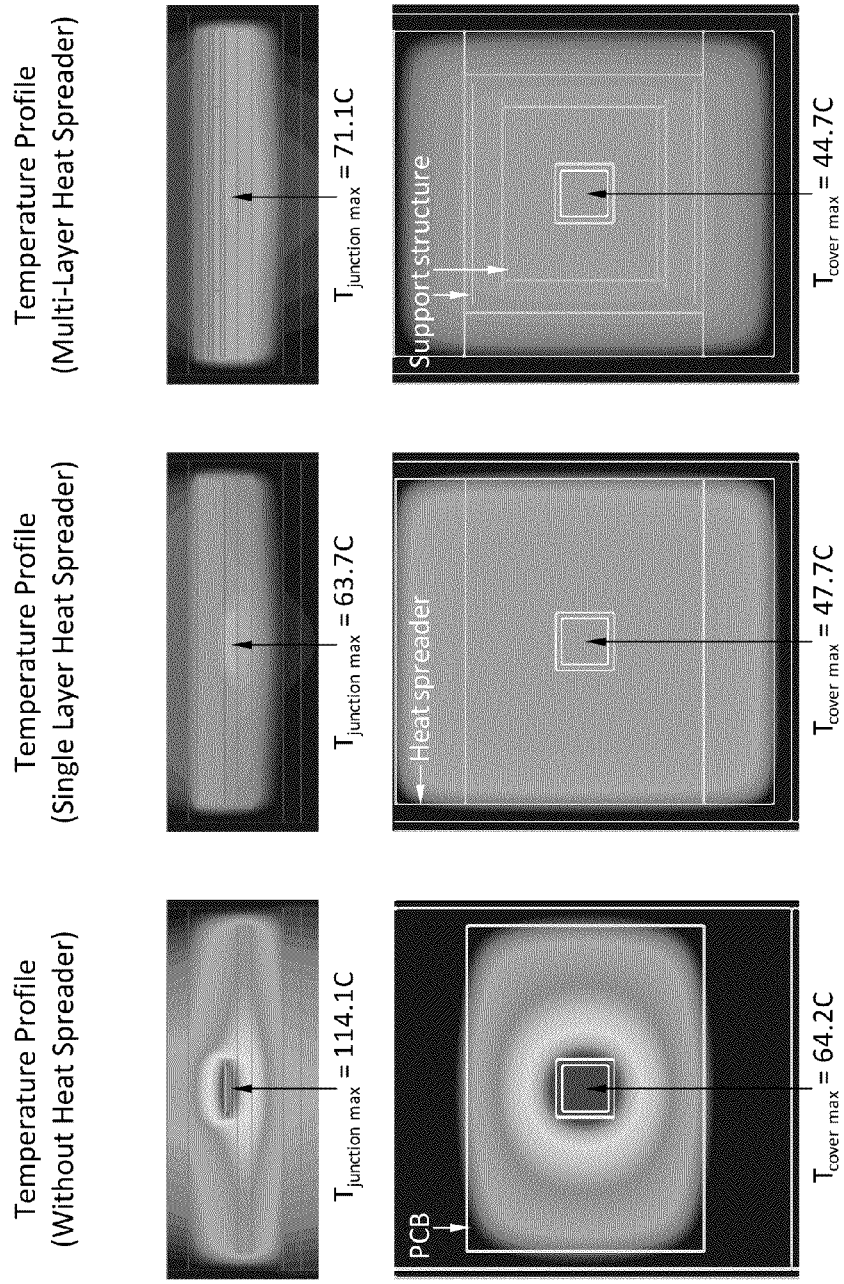
FIG. 22 illustrates a temperature profile of a mobile device without a heat spreader.
FIG. 23 illustrates a temperature profile of a prior art heat spreader in a mobile device.
FIG. 24 illustrates a temperature profile of a multi-layer heat spreader in an electronic device.

FIGS. 22, 23 and 24 illustrate three temperature profiles for three electronic devices. FIG. 22 illustrates a temperature profile of an electronic device without a heat spreader coupled to an integrated device. FIG. 22 illustrates that the maximum temperature of the integrated device (which is conventionally called a junction temperature) is about 114.1 degree Celsius. FIG. 22 also illustrates that the maximum surface temperature of the electronic device with a single layer heat spreader is 64.2 degree Celsius.

FIG. 23 illustrates a temperature profile of an electronic device with a single layer heat spreader coupled to an integrated device. FIG. 23 illustrates that the maximum temperature of the integrated device is about 63.7 degree Celsius. FIG. 23 also illustrates that the maximum surface temperature of the electronic device with a single layer heat spreader is 47.7 degree Celsius.

FIG. 24 illustrates a temperature profile of an electronic device that includes a multi-layer heat dissipating device coupled to an integrated device. As shown in FIG. 24, the maximum temperature of the integrated device is 71.1 degree Celsius. FIG. 24 also illustrates that the maximum surface temperature of the electronic device with a multi-layer heat dissipating device is 44.7 degree Celsius. In some implementations, the multi-layer heat dissipating device, as described in the present disclosure, does a better and more efficient job of dissipating and spreading the heat from the integrated device through the electronic device, than a single layer heat dissipating device, as shown in FIG. 23.

Thus, FIG. 24 illustrates how the multi-layer heat dissipating devices of the present disclosure provides an efficient and counter intuitive way/method of reducing the heat from an integrated device while at the same time minimizing the heat and/or the temperature that is felt by a user of an electronic device (e.g., mobile device). In particular, FIGS. 23 and 24 illustrate how a multi-layer heat dissipating device of a same, similar or comparable size to a single layer heat dissipating device can do a more effective and efficient job of dissipating heat from an integrated device without increasing the surface temperature of an electronic device beyond a temperature threshold.

Exemplary Multi-Layer Heat Dissipating Device

In the present disclosure, numerous configurations, embodiments and implementations of a multi-layer heat dissipating device are described. In some implementations, other configurations of a multi-layer heat dissipating device may be implemented without departing from the spirit of the disclosure.

Figure 25:
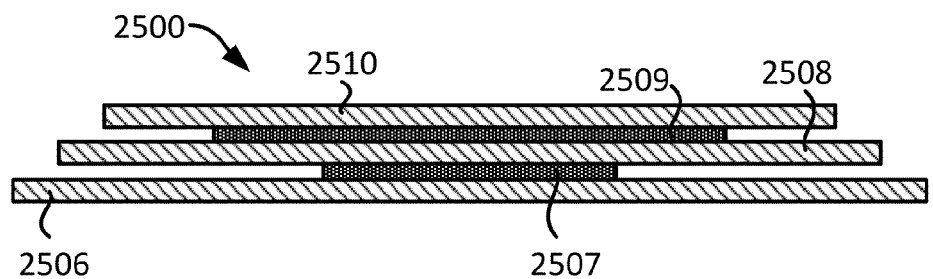
FIG. 25 illustrates a multi-layer heat dissipating device with a pyramid configuration.

FIG. 25 illustrates a multi-layer heat dissipating device 2500 with a pyramid configuration. As shown in FIG. 25, the multi-layer heat dissipating device 2500 includes a first heat spreader layer 2506, a first support structure 2507, a second heat spreader layer 2508, a second support structure 2509, and a third heat spreader layer 2510. FIG. 25 illustrates that the second support structure 2509 is greater (e.g., wider, longer, bigger diameter, bigger circumference) than the first support structure 2507.

In some implementations, in a pyramid configuration, the size of the first heat spreader layer 2506 is greater than the size of the second heat spreader layer 2508. The second heat spreader layer 2508 is greater than the third heat spreader layer 2510.

In some implementations, a multi-layer heat dissipating device may have an inverted pyramid structure. In such a configuration, the size a first heat spreader layer may be less than the size of the second heat spreader layer. In some implementations, the size of the second heat spreader layer may be less than the size of a third heat spreader layer.

In some implementations, at least one of the heat spreader layers has a high thermal conductivity value. In some implementations, at least one of the support structures has a low thermal conductivity value.

The present disclosure illustrates a heat spreader layer as having a square shape. However, different implementations may have different shapes. For example, in some implementations, one or more heat spreader layers may have a rectangular shape, an oval shape, and/or a circular shape.

In addition, a heat spreader layer may have similar or different thicknesses. That is, a first heat spreader layer may have a first thickness, a second heat spreader layer may have a second thickness that may be the same or different to the first thickness.

Figure 26:
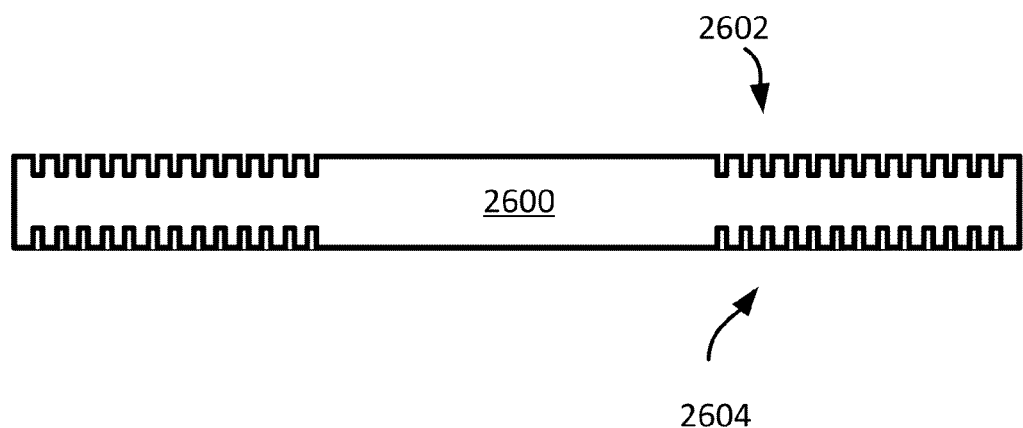
FIG. 26 illustrates a heat spreader layer of a multi-layer heat dissipating device that includes fins.

In some implementations, a heat spreader layer may include a set of fins. FIG. 26 illustrates an example of a heat spreader layer 2600 that includes fins. In some implementations, one or more fins in the heat spreader layer may improve the lateral heat dissipation of the heat spreader layer, by increasing the surface area of the heat spreader layer. As shown in FIG. 26, the heat spreader layer 2600 includes a first set of fins 2602 on the first surface of the heat spreader layer 2600. The heat spreader layer 2600 also includes a set second of fins 2604 on the second surface of the heat spreader layer 2600. In some implementations, the first set of fins 2602 and the second set of fins 2604 are grooves in the heat spreader layer 2600. In some implementations, the heat spreader layer 2600 has a high thermal conductivity value. In some implementations, the heat spreader layer 2600 may be implemented in any of the multi-layer heat dissipating device described in the present disclosure.

The present disclosure illustrates many different apparatuses (e.g., multi-layer heat dissipating device) that includes a first heat spreading means, a first supporting means, a second heat spreading means, a second supporting means, and a third heat spreading means. Different implementations may use different configurations of the heat spreading means and the supporting means. A heat spreading means may include a heat spreader layer, a heat spreader structure, a fin, a heat sink, and/or a first structure (e.g., heat exchanger) that moves heat between a heat source and a second structure (e.g., secondary heat exchanger) whose surface area and/or geometry is more favorable than the source.

Exemplary Electronic Devices

Figure 27:
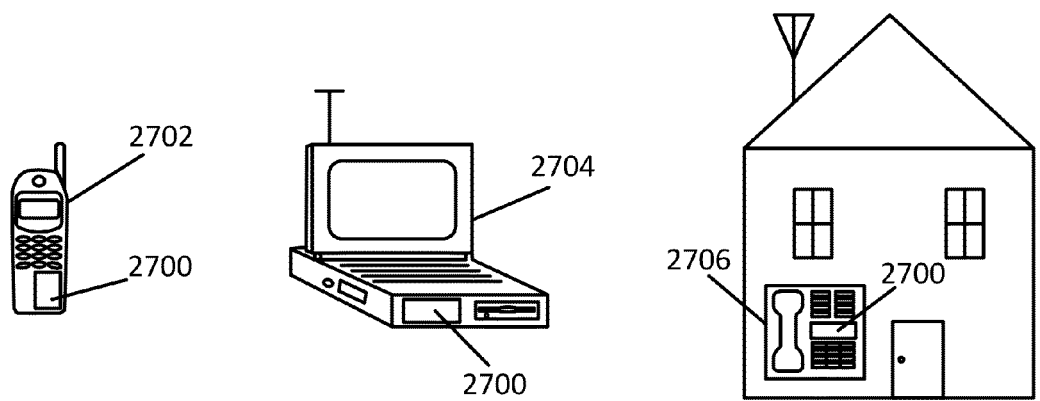
FIG. 27 illustrates various electronic devices that may integrate a semiconductor device, an integrated device, a die, an integrated circuit, a PCB and/or a multi-layer heat spreader described herein.

FIG. 27 illustrates various electronic devices that may be integrated with any of the aforementioned semiconductor device, integrated circuit, die, interposer, package and/or heat dissipating device. For example, a mobile telephone 2702, a laptop computer 2704, and a fixed location terminal 2706 may include an integrated circuit (IC) 2700 as described herein (or an integrated device that includes a heat dissipating device). The IC 2700 may be, for example, any of the integrated circuits, dice or packages described herein. The devices 2702, 2704, 2706 illustrated in FIG. 27 are merely exemplary. Other electronic devices may also feature the IC 2700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 4, 5, 6, 7, 8, 9, 10, 11, 12, 13, 14, 15, 16, 17, 18, 19, 20, 21, 22, 23, 24, 25, 26 and/or 27 may be rearranged and/or combined into a single component, step, feature or function or embodied in several components, steps, or functions. Additional elements, components, steps, and/or functions may also be added without departing from the disclosure. It should also be noted that FIGS. 4, 5, 6, 7, 8, 9, 10, 11, 12, 13, 14, 15, 16, 17, 18, 19, 20, 21, 22, 23, 24, 25, 26 and/or 27 and its corresponding description in the present disclosure is not limited to dies and/or ICs. In some implementations, FIGS. 4, 5, 6, 7, 8, 9, 10, 11, 12, 13, 14, 15, 16, 17, 18, 19, 20, 21, 22, 23, 24, 25, 26 and/or 27 and its corresponding description may be used to manufacture, create, provide, and/or produce integrated devices. In some implementations, an integrated device may include a die package, an integrated circuit (IC), integrated package device, a wafer, system-on-chip (SoC), and/or a semiconductor device.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The term "region configured to generate heat" is intended to mean a region that includes one or more component, circuit, and/or module that is configured to generate heat and/or capable of generating heat when active, on, or performing an electric operation. A component that is off and not producing any heat when off may be considered a component configured to generate heat if the component generates heat when the component is on (e.g., running). In some implementations, the "region configured to generate heat" is intended to mean a "component configured to generate heat."

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A multi-layer heat dissipating device comprising:
   a first heat spreader layer comprising a first spreader surface and a second spreader surface;
   a first support structure comprising a first support surface and a second support surface, wherein the first support surface of the first support structure is coupled to the second spreader surface of the first heat spreader; and
   a second heat spreader layer comprising a third spreader surface and a fourth spreader surface, wherein the third spreader surface of the second heat spreader layer is coupled to the second support surface of the first support structure, wherein a gap is located within a region at least partially surrounded by the first heat spreader layer, the first support structure and the second heat spreader layer.

2. The multi-layer heat dissipating device of claim 1, wherein the first heat spreader layer has a first thermal conductivity, and the first support structure has a second thermal conductivity that is less than the first thermal conductivity.

3. The multi-layer heat dissipating device of claim 1, wherein the first support structure comprises a thermally conductive adhesive layer.

4. The multi-layer heat dissipating device of claim 1, wherein the first support structure is coupled to the first heat spreader layer through a thermally conductive adhesive layer.

5. The multi-layer heat dissipating device of claim 1, further comprising
   a second support structure comprising a third support surface and a fourth support surface, wherein the third support surface of the second support structure is coupled to the fourth spreader surface of the second heat spreader; and
   a third heat spreader layer comprising a fifth spreader surface and a sixth spreader surface, wherein the fifth spreader surface of the third heat spreader layer is coupled to the fourth support surface of the second support structure.

6. The multi-layer heat dissipating device of claim 5, wherein the first support structure has a first size, and the second support structure has a second size that is greater than the first size.

7. The multi-layer heat dissipating device of claim 5, wherein the second heat spreader layer has a third thermal conductivity, and the second support structure has a fourth thermal conductivity that is less than the third thermal conductivity.

8. The multi-layer heat dissipating device of claim 1, wherein the first surface of the first heat spreader layer is coupled to a heat generating region and/or a region configured to generate heat.

9. The multi-layer heat dissipating device of claim 1, wherein the first heat spreader layer includes a first set of fins.

10. The multi-layer heat dissipating device of claim 1, wherein the first surface of the first heat spreader layer is coupled to at least one heat generating component and/or component configured to generate heat when active.

11. The multi-layer heat dissipating device of claim 1, wherein the first heat spreader layer is coupled to the heat generating component through a thermal interface material.

12. The multi-layer heat dissipating device of claim 1, wherein the second surface of the second heat spreader layer is coupled to an inner portion of a first surface of an electronic device.

13. The multi-layer heat dissipating device of claim 1, wherein the multi-layer heat dissipating device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

14. An apparatus comprising:
    a first heat spreading means for dissipating heat;
    a first supporting means coupled to the first heat spreading means; and
    a second heat spreading means for dissipating heat, wherein the second heat spreading means is coupled to the first supporting means, wherein a gap is located within a region at least partially surrounded by the first heat spreading means, the first supporting means and the second heat spreading means.

15. The apparatus of claim 14, wherein the first heat spreading means has a first thermal conductivity, and the first supporting means has a second thermal conductivity that is less than the first thermal conductivity.

16. The apparatus of claim 14, wherein the first supporting means is coupled to the first heat spreading means through a thermally conductive adhesive means.

17. The apparatus of claim 14, further comprising
    a second supporting means coupled to the second heat spreading means; and
    a third heat spreading means for dissipating heat, wherein the third heat spreading means is coupled to the second supporting means.

18. The apparatus of claim 14, wherein the first heat spreading means is coupled to a heat generating region and/or a region configured to generate heat.

19. The apparatus of claim 18, wherein the heat generating region includes an integrated package.

20. The apparatus of claim 14, wherein the second heat spreading means is coupled to an inner portion of a first surface of an electronic device.

21. The apparatus of claim 14, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

22. A device comprising:
    a region configured to generate heat, the region comprising an integrated device;
    a first heat spreader layer comprising a first spreader surface and a second spreader surface, wherein the first spreader surface of the first heat spreader layer is coupled to the region;
    a first support structure comprising a first support surface and a second support surface, wherein the first support surface of the first support structure is coupled to the second spreader surface of the first heat spreader; and
    a second heat spreader layer comprising a third spreader surface and a fourth spreader surface, wherein the third spreader surface of the second heat spreader layer is coupled to the second support surface of the first support structure, wherein a gap is located within a region at least partially surrounded by the first heat spreader layer, the first support structure and the second heat spreader layer.

23. The device of claim 22, further comprising an electronic device surface, wherein the electronic device surface is coupled to the fourth spreader surface of the second heat spreader.

24. The device of claim 22, further comprising
    a second support structure comprising a third support surface and a fourth support surface, wherein the third support surface of the second support structure is coupled to the fourth spreader surface of the second heat spreader;

a third heat spreader layer comprising a fifth spreader surface and a sixth spreader surface, wherein the fifth spreader surface of the third heat spreader layer is coupled to the fourth support surface of the second support structure; and an electronic device surface, wherein the electronic device surface is coupled to the sixth spreader surface of the third heat spreader.

25. The device of claim 22, wherein the first heat spreader layer has a first thermal conductivity, and the first support structure has a second thermal conductivity that is less than the first thermal conductivity.

26. The device of claim 22, wherein the first spreader surface of the first heat spreader layer is coupled to the integrated device.

27. The device of claim 22, wherein the region includes a printed circuit board (PCB).

28. The device of claim 22, wherein the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *